(12) United States Patent
Neill

(10) Patent No.: US 12,434,296 B2
(45) Date of Patent: Oct. 7, 2025

(54) ADDITIVE MANUFACTURING OF DEVICES FROM ASSEMBLIES OF DISCRETIZED COMPONENT VOXEL ELEMENTS

(71) Applicant: Advanced Printed Electronic Solutions LLC, New York, NY (US)

(72) Inventor: Richard Neill, Garrison, NY (US)

(73) Assignee: ADVANCED PRINTED ELECTRONIC SOLUTIONS LLC, Fishkill, NY (US)

(*) Notice: Subject to any disclaimer, the term of this patent is extended or adjusted under 35 U.S.C. 154(b) by 808 days.

(21) Appl. No.: 17/155,976

(22) Filed: Jan. 22, 2021

(65) Prior Publication Data

US 2021/0229091 A1 Jul. 29, 2021

Related U.S. Application Data

(60) Provisional application No. 62/966,922, filed on Jan. 28, 2020.

(51) Int. Cl.
*H05K 7/02* (2006.01)
*B22F 10/10* (2021.01)
(Continued)

(52) U.S. Cl.
CPC ............ *B22F 10/10* (2021.01); *B29C 64/171* (2017.08); *H05K 7/023* (2013.01); *H05K 7/026* (2013.01); *B33Y 80/00* (2014.12)

(58) Field of Classification Search
CPC ........ B22F 10/10; B22F 2999/00; B22F 7/08; B29C 64/171; B29C 64/10; H05K 7/023;
(Continued)

(56) References Cited

U.S. PATENT DOCUMENTS 5,807,448 A 9/1998 Nakazawa
9,440,397 B1 * 9/2016 Fly .................. B29C 64/171
(Continued)

FOREIGN PATENT DOCUMENTS

WO WO 2015/091729 6/2015
WO WO 2018/154277 8/2018
(Continued)

OTHER PUBLICATIONS

PCT Invitation to Pay Additional Fees and, Where Applicable, Protest Fee in International Appln. No. PCT/US2021/014643, mailed Mar. 23, 2021, 2 pages.
(Continued)

*Primary Examiner* — Santosh R Poudel
(74) *Attorney, Agent, or Firm* — Fish & Richardson P.C.

(57) ABSTRACT

An additive manufactured apparatus includes an assembly of additive manufactured component voxels, each additive manufactured component voxel exhibiting a corresponding functionality. Each additive manufactured component voxel includes a base layer, an outer layer, an interior space of the component voxel being defined in a volume adjacent to the base layer and the outer layer, and a component structure associated with the functionality of the component voxel. The component structure is one or more of (i) disposed in the interior space of the component voxel and (ii) embedded in the base layer. A method for designing an apparatus to be fabricated by additive manufacturing includes defining an arrangement of component voxels based on the geometric mesh and based on a specified functionality of the apparatus, and generating machine-readable instructions for manufacturing of the arrangement of component voxels.

39 Claims, 34 Drawing Sheets

(51) Int. Cl.
*B29C 64/171* (2017.01)
*B33Y 80/00* (2015.01)

(58) Field of Classification Search
CPC .... H05K 7/026; H05K 7/20254; B33Y 80/00; B33Y 10/00; B33Y 30/00; H01L 23/473; Y02P 10/25
See application file for complete search history.

(56) References Cited

U.S. PATENT DOCUMENTS

| | | | |
|---|---|---|---|
| 9,506,485 | B2 | 11/2016 | Gershenfeld et al. |
| 10,052,858 | B2* | 8/2018 | Segal .................. B32B 37/0046 |
| 10,375,834 | B1* | 8/2019 | Liu .......................... H05K 1/14 |
| 2011/0123794 | A1 | 5/2011 | Hiller et al. |
| 2013/0025961 | A1* | 1/2013 | Koh ..................... G10K 11/162 181/207 |
| 2013/0297059 | A1 | 11/2013 | Grifith et al. |
| 2014/0273730 | A1 | 9/2014 | Brandwijk |
| 2015/0142153 | A1* | 5/2015 | Chun ..................... B29C 64/40 700/98 |
| 2015/0201500 | A1 | 7/2015 | Shinar et al. |
| 2015/0259099 | A1* | 9/2015 | Segal ..................... G06F 30/13 206/499 |
| 2016/0096318 | A1* | 4/2016 | Bickel ................... B33Y 30/00 425/150 |
| 2017/0043485 | A1 | 2/2017 | Langford et al. |
| 2018/0018815 | A1 | 1/2018 | Morovic et al. |
| 2018/0050486 | A1* | 2/2018 | Talgorn ................. B33Y 30/00 |
| 2018/0299066 | A1 | 10/2018 | Erno et al. |
| 2019/0030788 | A1 | 1/2019 | Erickson et al. |
| 2019/0077098 | A1* | 3/2019 | Riley .................... B29C 70/545 |
| 2019/0081453 | A1* | 3/2019 | Meehan ................ H01L 25/167 |
| 2019/0351607 | A1* | 11/2019 | Huang ................. G01N 27/041 |
| 2022/0193535 | A1* | 6/2022 | Dunkers ............... A63F 9/0826 |

FOREIGN PATENT DOCUMENTS

| | | |
|---|---|---|
| WO | WO 2018/161994 | 9/2018 |
| WO | WO 2019/186070 | 10/2019 |

OTHER PUBLICATIONS

PCT International Search Report and Written Opinion in International Appln. No. PCT/US2021/014643, mailed Jun. 4, 2021, 13 pages.

Supplementary European Search Report in European Appln. No. EP 21747771, dated Jun. 5, 2023, 8 pages.

Lapine et al., Contemporary notes on metamaterials, IET Microwaves, Antennas & Propagation, Feb. 5, 2007, 1(1):3-11.

* cited by examiner

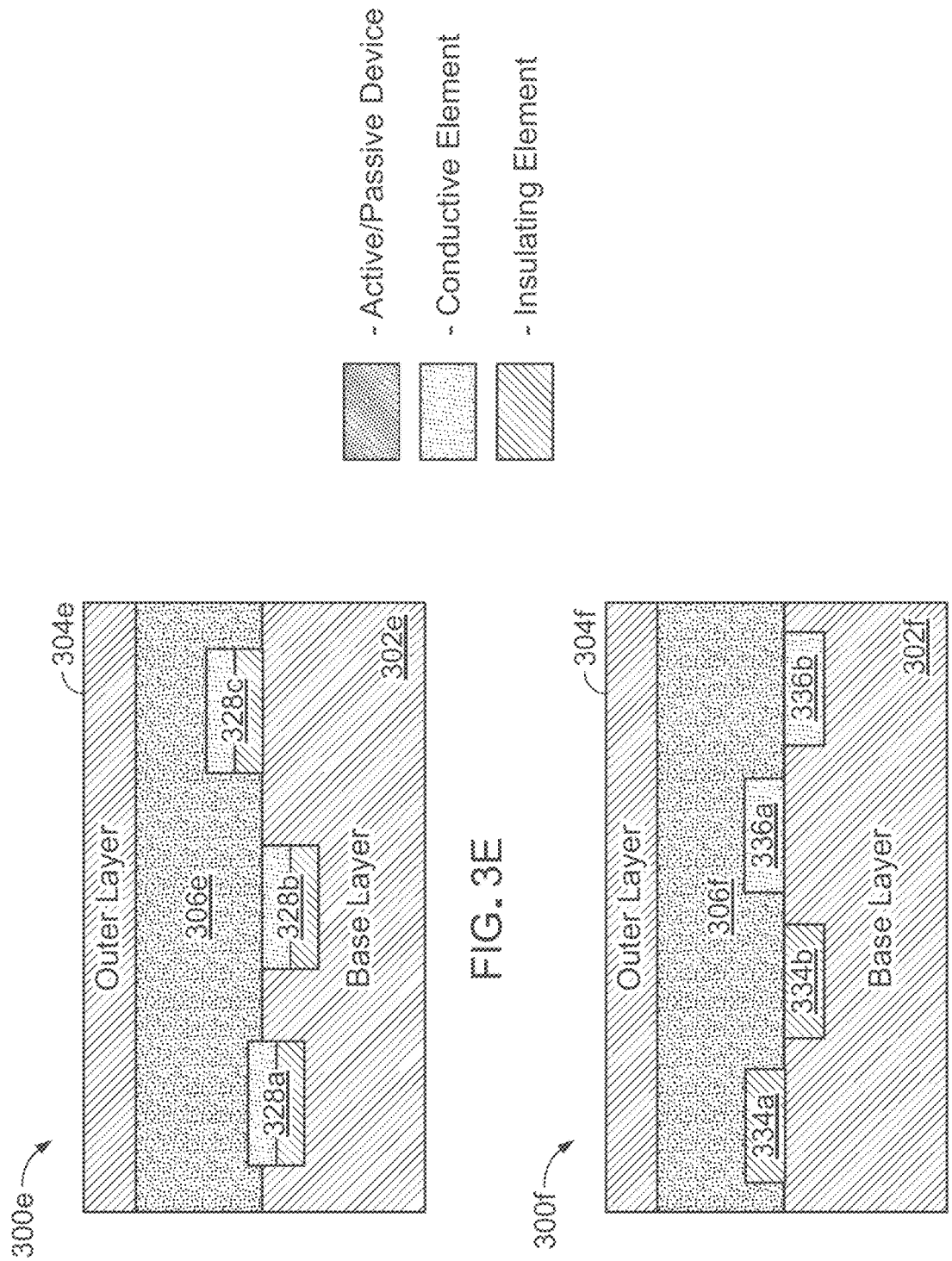

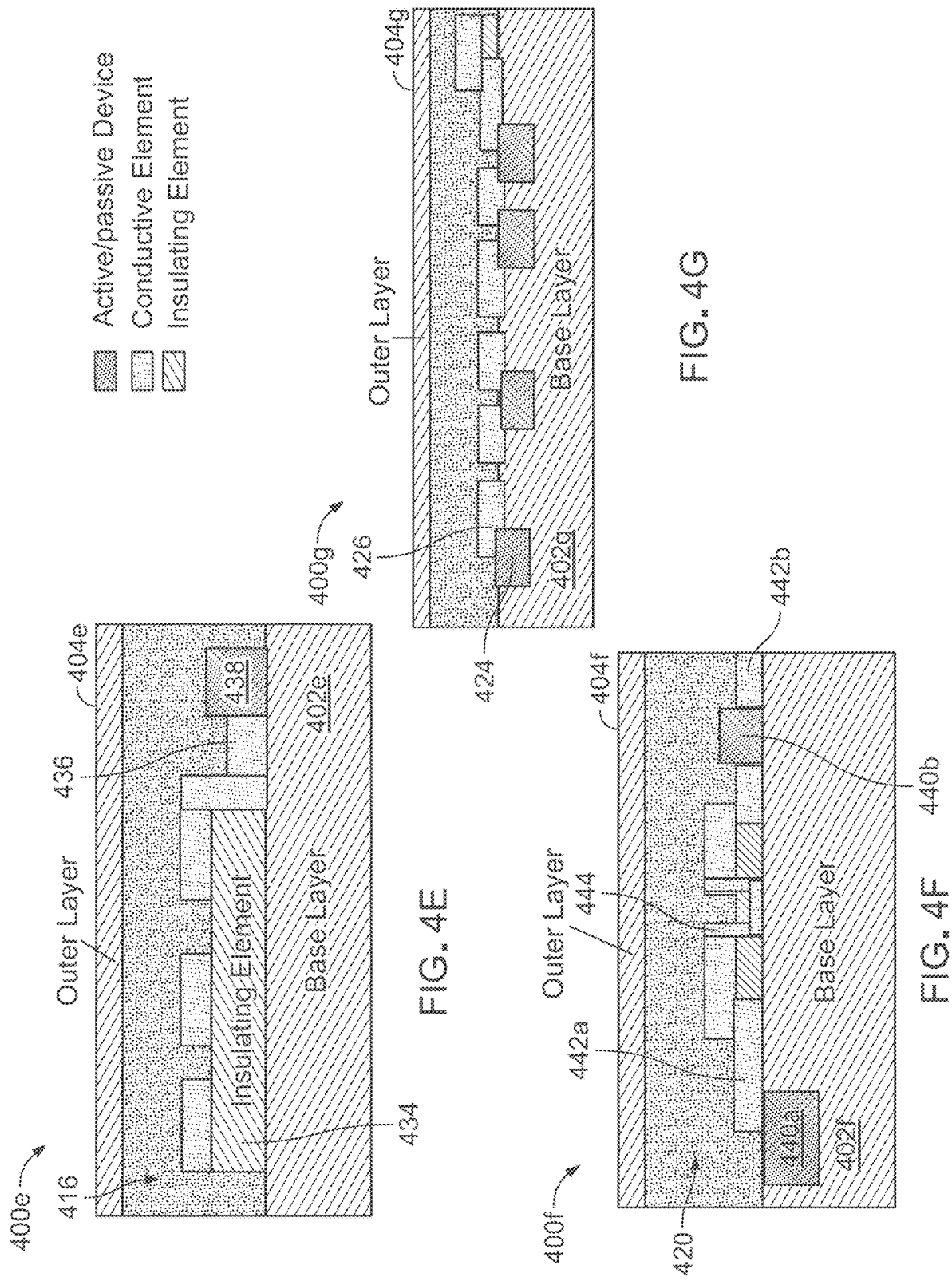

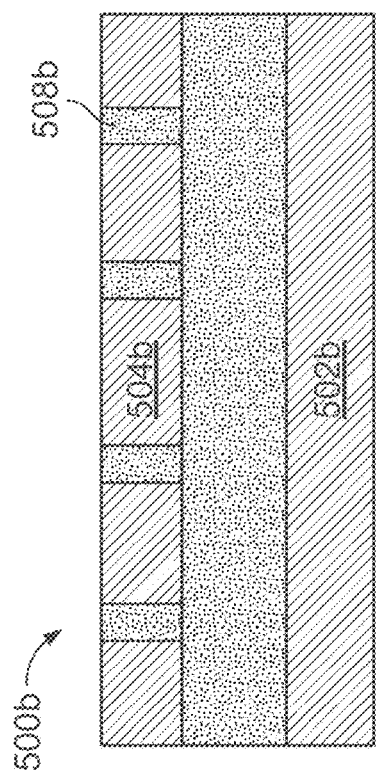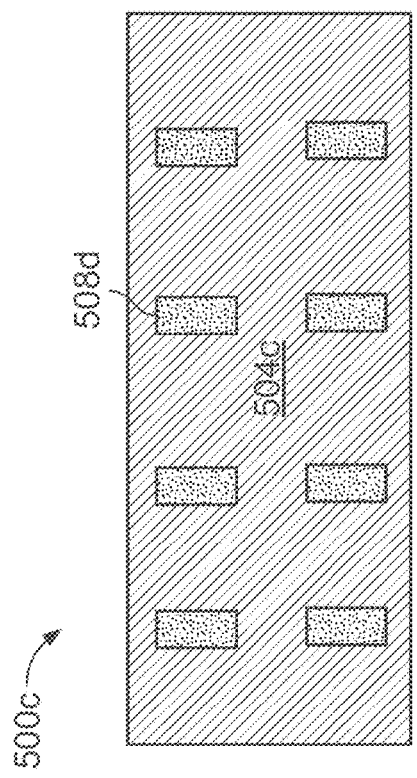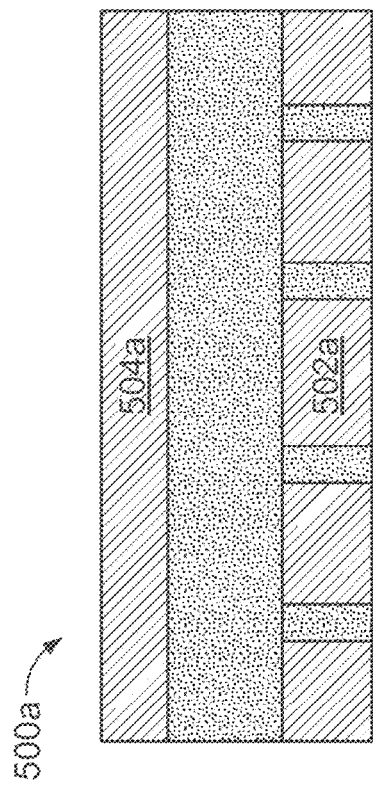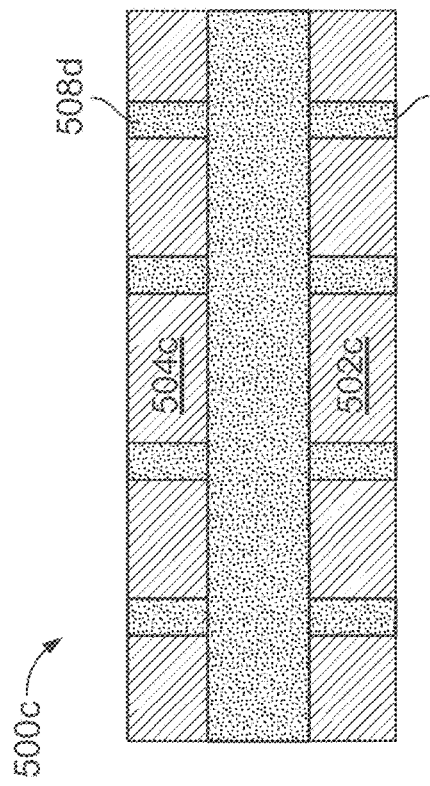

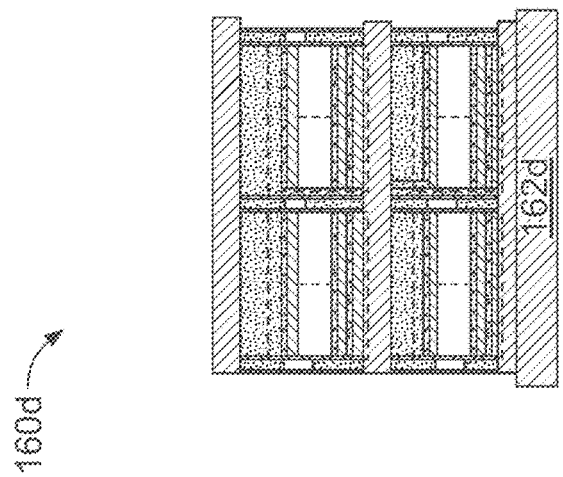
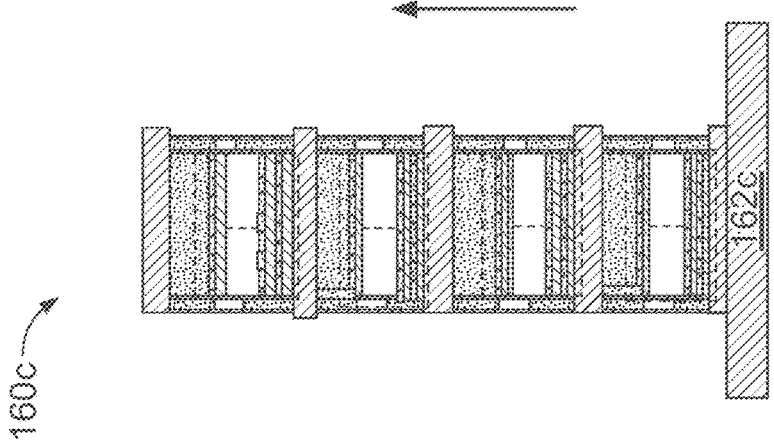
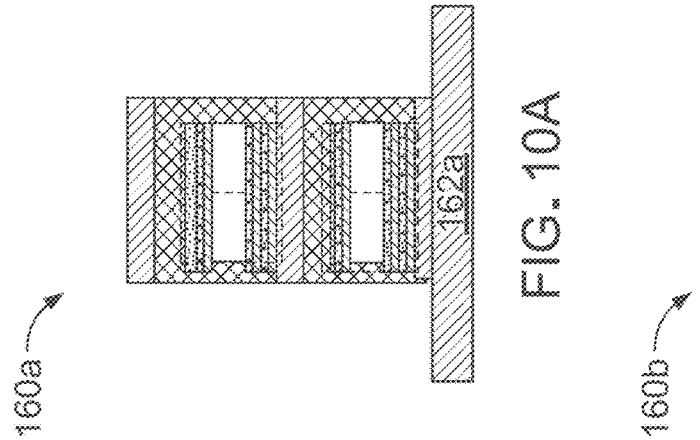
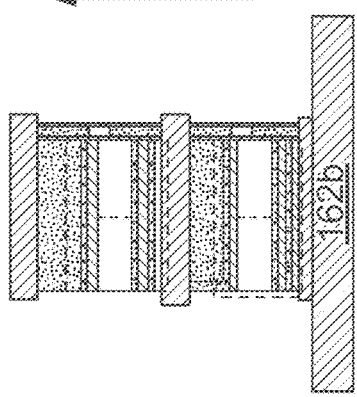

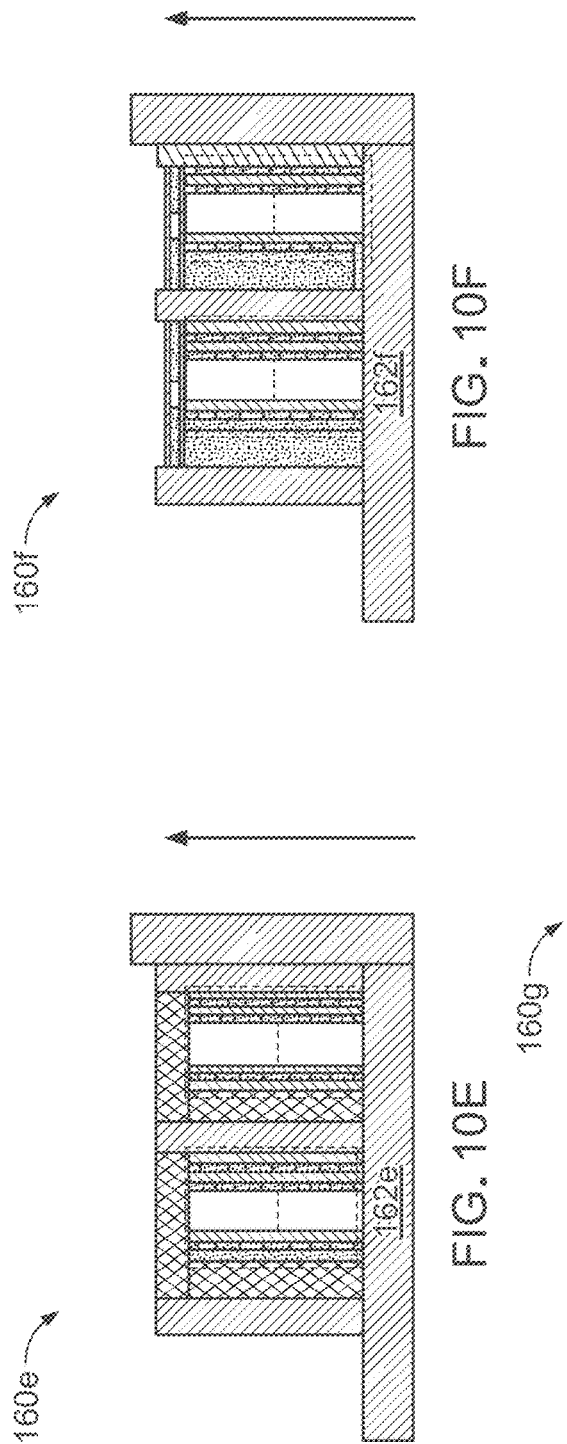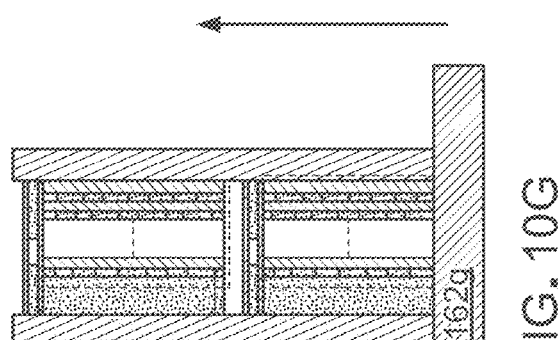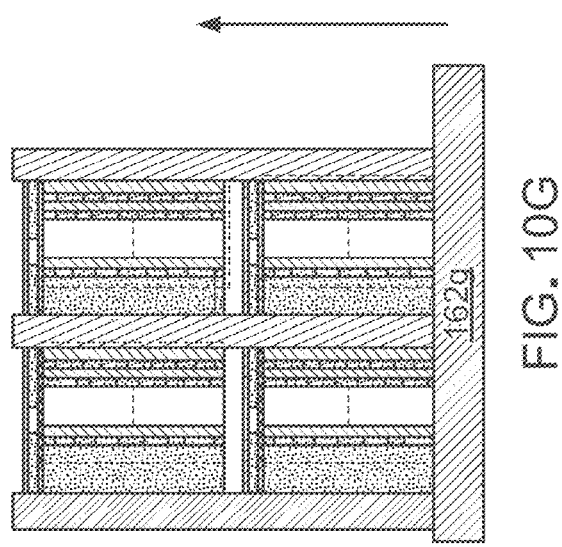

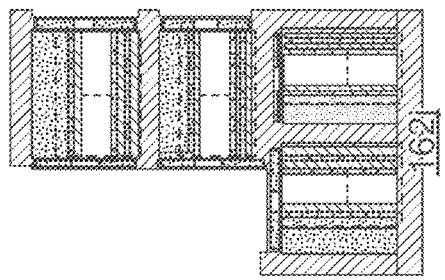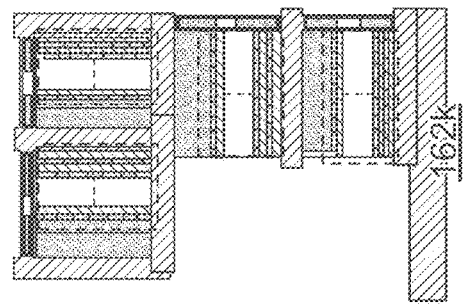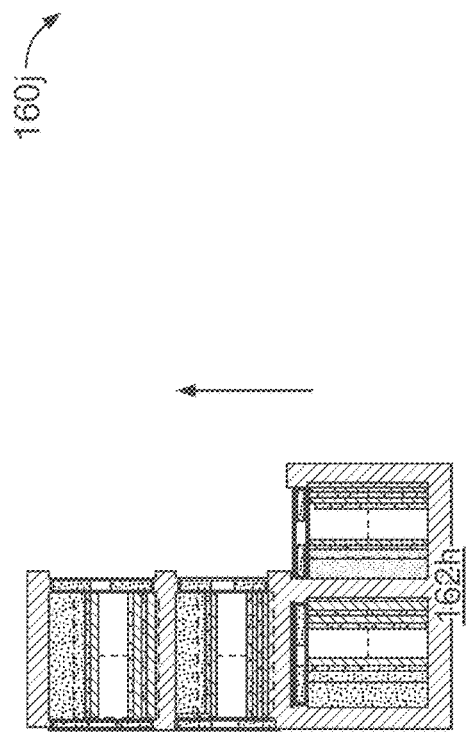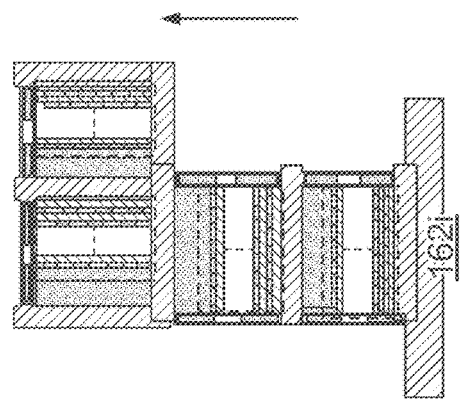

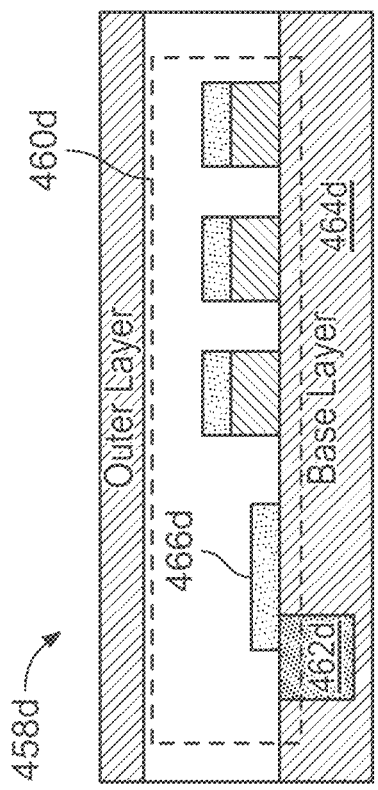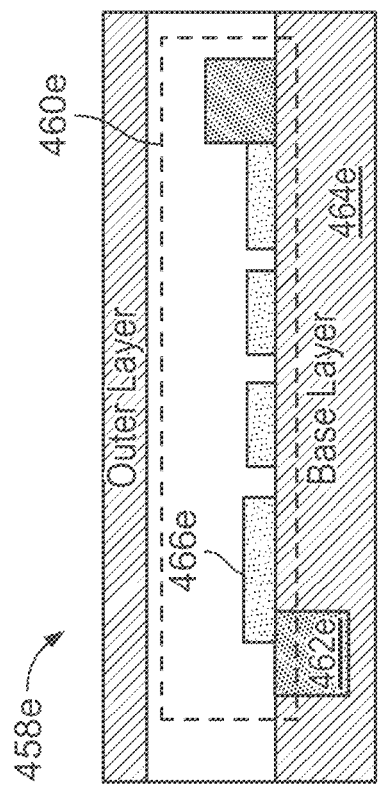
FIG. 13B    FIG. 13C
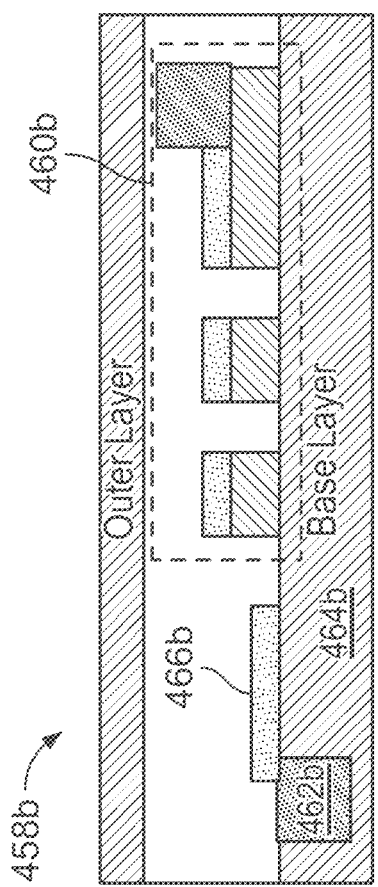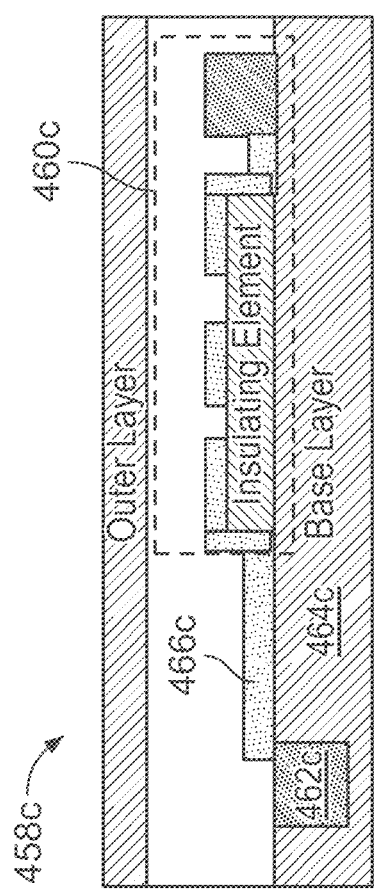
FIG. 13D    FIG. 13E

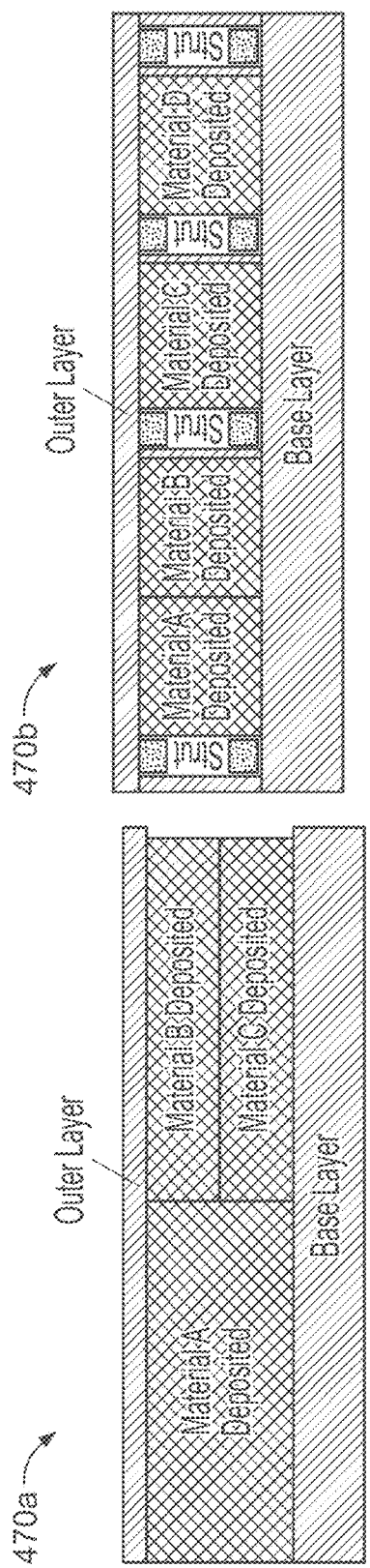
FIG. 14B
FIG. 14A
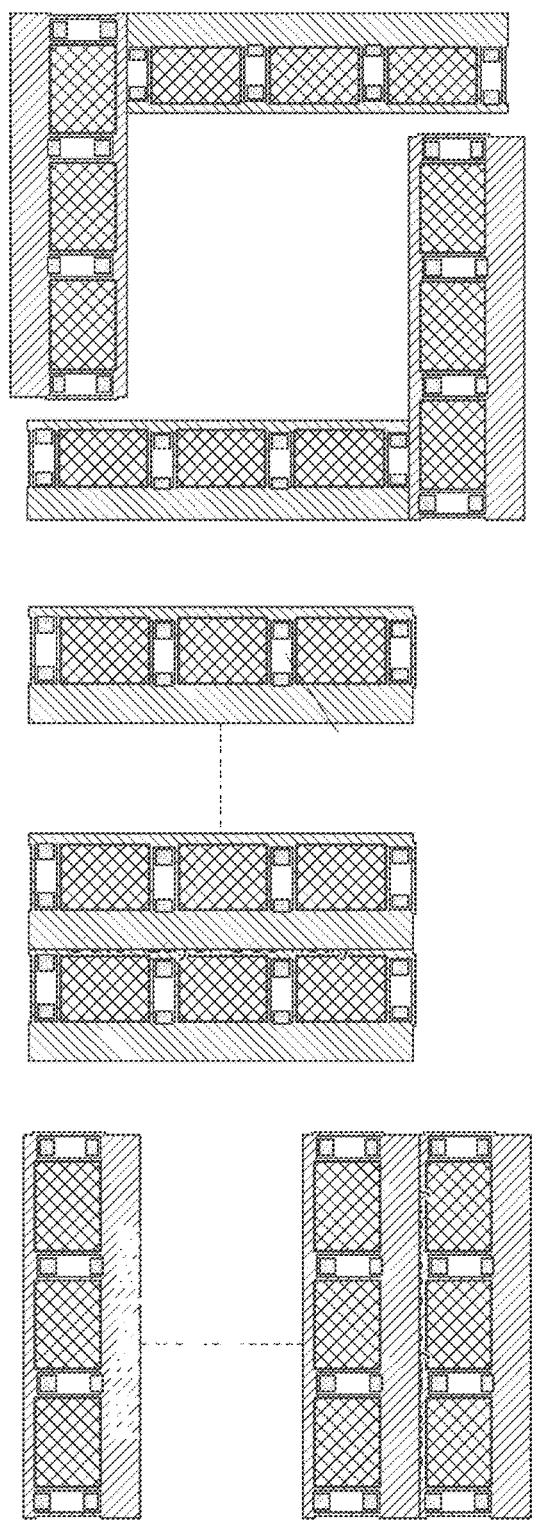
FIG. 14C

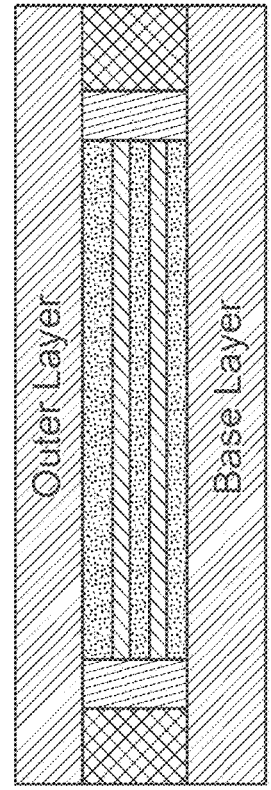
FIG. 15C
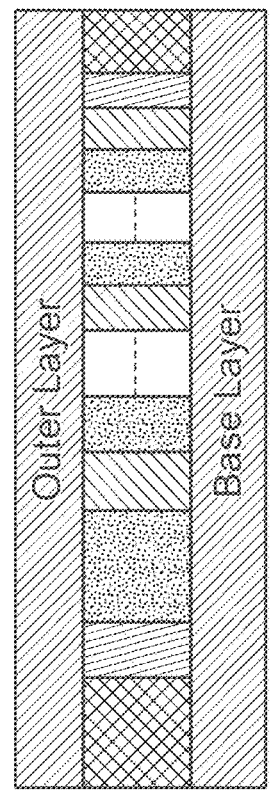
FIG. 15A
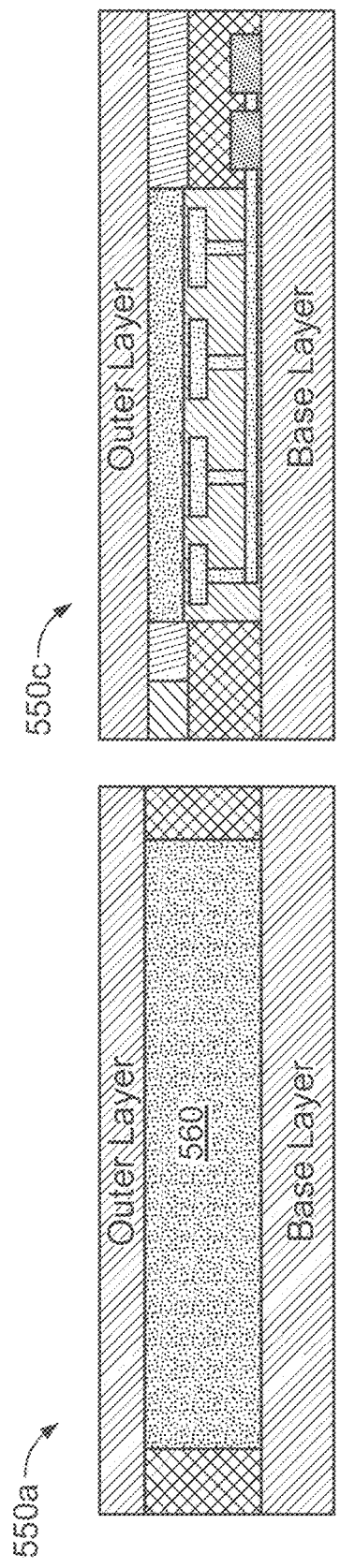
FIG. 15D
FIG. 15B

ADDITIVE MANUFACTURING OF DEVICES FROM ASSEMBLIES OF DISCRETIZED COMPONENT VOXEL ELEMENTS

CLAIM OF PRIORITY

This application claims priority to U.S. Patent Application Ser. No. 62/966,922, filed on Jan. 28, 2020, the contents of which are incorporated here by reference in their entirety.

BACKGROUND

Additive manufacturing techniques, such as three-dimensional (3D) printing, are used for layer-by-layer assembly of complex, 3D structures.

SUMMARY

The approaches described here enable the fabrication of devices, systems, or subsystems having a specified geometry and functionality by an integrated set of design patterns, computation methods, and manufacturing processes, e.g., incorporating additive manufacturing and computational techniques. The devices, systems, or subsystems to be fabricated (referred to collectively as a "target device") are discretized into an assembly of component voxels, each having a geometry, material properties, and functionality that contributes to the overall geometry and functionality of the target device while satisfying one or more performance criteria. Each component voxel may be composed of one or more types of materials, can include elements such as structural constructs and material properties that contribute to mechanical integrity of the target device; active or passive devices such as electronic, magnetic, optical, microfluidic, metamaterial, or other devices; electrical interconnections; fluidic networks for thermal management, or other elements.

In an aspect, an additive manufactured apparatus includes an assembly of additive manufactured component voxels, each additive manufactured component voxel exhibiting a corresponding functionality. Each additive manufactured component voxel includes a base layer; an outer layer, an interior space of the component voxel being defined in a volume adjacent to the base layer and the outer layer; and a component structure associated with the functionality of the component voxel, the component structure being one or more of (i) disposed in the interior space of the component voxel and (ii) embedded in the base layer.

Embodiments can include one or any combination of two or more of the following features.

At least one component voxel includes a mechanical support element extending from the base layer to the outer layer of the component voxel. The mechanical support element includes one or more of a strut structure and a lattice structure.

The assembly of component voxels includes one or more levels of component voxels, and in which the apparatus includes a surface layer disposed on an outermost level of the assembly of component voxels. The surface layer includes a conformal surface layer.

At least one of the component voxels includes electrical interconnection circuitry electrically connected to electrical interconnection circuitry of one or more other component voxels of the assembly.

At least one of the component voxels includes a fluidic network structure fluidically connected to a fluidic network structure of one or more other component voxels of the assembly.

The component structure of at least one component voxel of the assembly includes an electronic device.

The component structure of at least one component voxel of the assembly includes at least one of a microfluidic device and a microfluidic channel.

The component structure of at least one component voxel of the assembly includes a metamaterial device.

The component structure is configured to provide structural integrity to the component voxel.

The component structure is configured to enable heat transfer within the component voxel, to the component voxel, or from the component voxel.

The component structure of at least one component voxel of the assembly includes one or more of a conductive element and an electrically insulating element disposed on an interior surface of the component voxel.

The base layer of at least one component voxel of the assembly has an orientation different than the base layer of one or more other component voxels of the assembly.

At least one of the component voxels includes multiple base layers, with the component structure being one or more of (i) disposed in the interior space of the component voxel and (ii) embedded in one of the multiple base layers.

The interior space of at least one of the component voxels is defined between the base layer and the outer layer.

In an aspect, a method for fabricating a device includes fabricating an assembly of component voxels, each component voxel having a corresponding functionality. Fabricating each component voxel of the assembly includes forming a base layer and an outer layer by an additive manufacturing process, an interior space of the component voxel being defined in a volume adjacent to the base layer and the outer layer; and forming a component structure associated with the functionality of the component voxel, including one or more of (i) disposing the component structure in the interior space of the component voxel and (ii) by the additive manufacturing process, embedding the component structure in the base layer.

Embodiments can include one or any combination of two or more of the following features.

Disposing the component structure in the interior space of the component voxel includes fabricating the component structure by the additive manufacturing process.

The method includes, for at least one component voxel of the assembly, forming, by the additive manufacturing process, a mechanical support element extending from the base layer to the outer layer of the component voxel.

Forming a mechanical support element includes forming one or more of a strut and a lattice.

The assembly of component voxels includes one or more levels of component voxels, and the method including disposing, by the additive manufacturing process, a surface layer on an outermost level of the assembly of component voxels. Forming a surface layer includes forming a conformal surface layer.

The method includes, for at least one component voxel of the assembly: forming electrical interconnection circuitry by the additive manufacturing process. The electrical interconnection circuitry is electrically connected to electrical interconnection circuitry of one or more other component voxels of the assembly.

The method includes, for at least one component voxel of the assembly: forming a fluidic network structure by the additive manufacturing process. The fluidic network structure is fluidically connected to a fluidic network structure of one or more other component voxels of the assembly.

Forming a component structure includes, for at least one component voxel of the assembly, disposing the component structure in the interior space of the component voxel by a pick-and-place method.

Forming a component structure includes, for at least one component voxel of the assembly, disposing an electronic device in the interior space of the component voxel.

Forming a component structure includes, for at least one component voxel of the assembly, disposing one or more of a microfluidic device and a microfluidic channel in the interior space of the component voxel.

Forming a component structure includes, for at least one component voxel within the 3-dimensional apparatus structure, forming a metamaterial device in the interior space of the component voxel.

Disposing the component structure in the interior space of the component voxel includes, for at least one component voxel of the assembly, printing one or more of a conductive element and an insulating element on an interior surface of the component voxel.

Forming a component structure includes, for at least one component voxel of the assembly, concurrently forming the base layer and the component structure embedded in the base layer.

Forming a component structure includes, for at least one component voxel of the assembly: removing a portion of the base layer; and embedding the component structure in a space defined by the removal of the portion of the base layer.

The method includes fabricating a first component voxel of the assembly such that the base layer of the first component voxel has a first orientation; and fabricating a second component voxel of the assembly such that the base layer of the second component voxel has a second orientation different than the first orientation.

In an aspect, a method for designing an apparatus to be fabricated by additive manufacturing includes by one or more processors, partitioning a specified geometry of the apparatus into a geometric mesh including an assembly of mesh units each having a corresponding size and position. The method includes defining, by the one or more processors, an arrangement of component voxels based on the geometric mesh and based on a specified functionality of the apparatus, each component voxel corresponding to one or more mesh units of the assembly. The defining includes defining a size and position of each component voxel in the specified geometry of the apparatus; and assigning a component structure to each component voxel, wherein each component structure is associated with a functionality exhibited by the corresponding component voxel. The method includes by the one or more processors, generating machine-readable instructions for manufacturing of the arrangement of component voxels.

Embodiments can include one or any combination of two or more of the following features.

Generating machine-readable instructions includes generating machine-readable instructions for additive manufacturing of at least a portion of the arrangement of component voxels.

Defining the arrangement of component voxels includes assigning a mechanical support element to at least one component voxel.

Defining the arrangement of component voxels includes defining a fluidic network structure configured to fluidically connect component voxels in the arrangement.

Defining the arrangement of component voxels includes performing an optimization process to minimize a number of component voxels in the arrangement.

Defining the arrangement of component voxels includes performing an optimization process to maximize a volume of each component voxel.

Defining the arrangement of component voxels includes performing an optimization process based on a structural analysis and a thermal analysis.

Defining the arrangement of component voxels includes defining the composition and distribution of materials within the component voxels. Defining the composition and distribution of materials includes performing an optimization process based on structural analysis, topological optimization methodologies, or both.

The method includes defining an arrangement of a surface layer, the arrangement of the surface layer corresponding to an outer portion of the geometry of the apparatus.

Defining an arrangement of component voxels includes defining a single component voxel.

One or more component voxels and an imported electronic schematic netlist and part list are placed and routed in accordance to a user-defined implementation of the one or more component voxels.

The details of one or more implementations are set forth in the accompanying drawings and the description below. Other features and advantages will be apparent from the description and drawings, and from the claims.

BRIEF DESCRIPTION OF DRAWINGS

FIGS. 3A-3F are diagrams of example component voxels.

FIGS. 4A-4G are diagrams of example component voxels.

FIGS. 5A-5D are diagrams of example component voxels.

FIGS. 10A-10K are diagrams of example assemblies of component voxels.

FIGS. 13A-13E are diagrams of example metamaterial component voxels.

FIGS. 14A-14C are diagrams of example metamaterial component voxels.

FIGS. 15A-15D are diagrams of example microfluidic component voxels.

DETAILED DESCRIPTION

The approaches described here enable the fabrication of devices, systems, or subsystems having a specified geometry and functionality by an integrated set of design patterns, computation methods, and manufacturing processes, e.g., incorporating additive manufacturing and computational techniques. The devices, systems, or subsystems to be fabricated (referred to collectively as a "target device") are discretized into an assembly of component voxels, each having a geometry, material properties, and functionality that contributes to the overall geometry and functionality of the target device while satisfying one or more performance criteria. Each component voxel may be composed of one or more types of materials, can include elements such as structural constructs and material properties that contribute to mechanical integrity of the target device; active or passive devices such as electronic, magnetic, optical, microfluidic, metamaterial, or other devices; electrical interconnections; fluidic networks for thermal management, or other elements. The assembly of component voxels for a target device is fabricated by an integrated manufacturing workflow process that involves one or more additive manufacturing processes, such as three-dimensional (3D) printing or other approaches to materials deposition, robotic or actuated placement of components, or other additive manufacturing processes. Computational techniques are utilized to optimize the material, functional, and thermal characteristics of each component voxel element. Collectively, these approaches to design and fabrication of target devices based on assemblies of component voxels are flexible, are generic, and can be used for manufacture of a wide range of target devices, e.g., ranging from highly miniaturized (e.g., on the order of microns or millimeters) devices to large-scale (e.g., multiple meters) devices.

Figure 1:
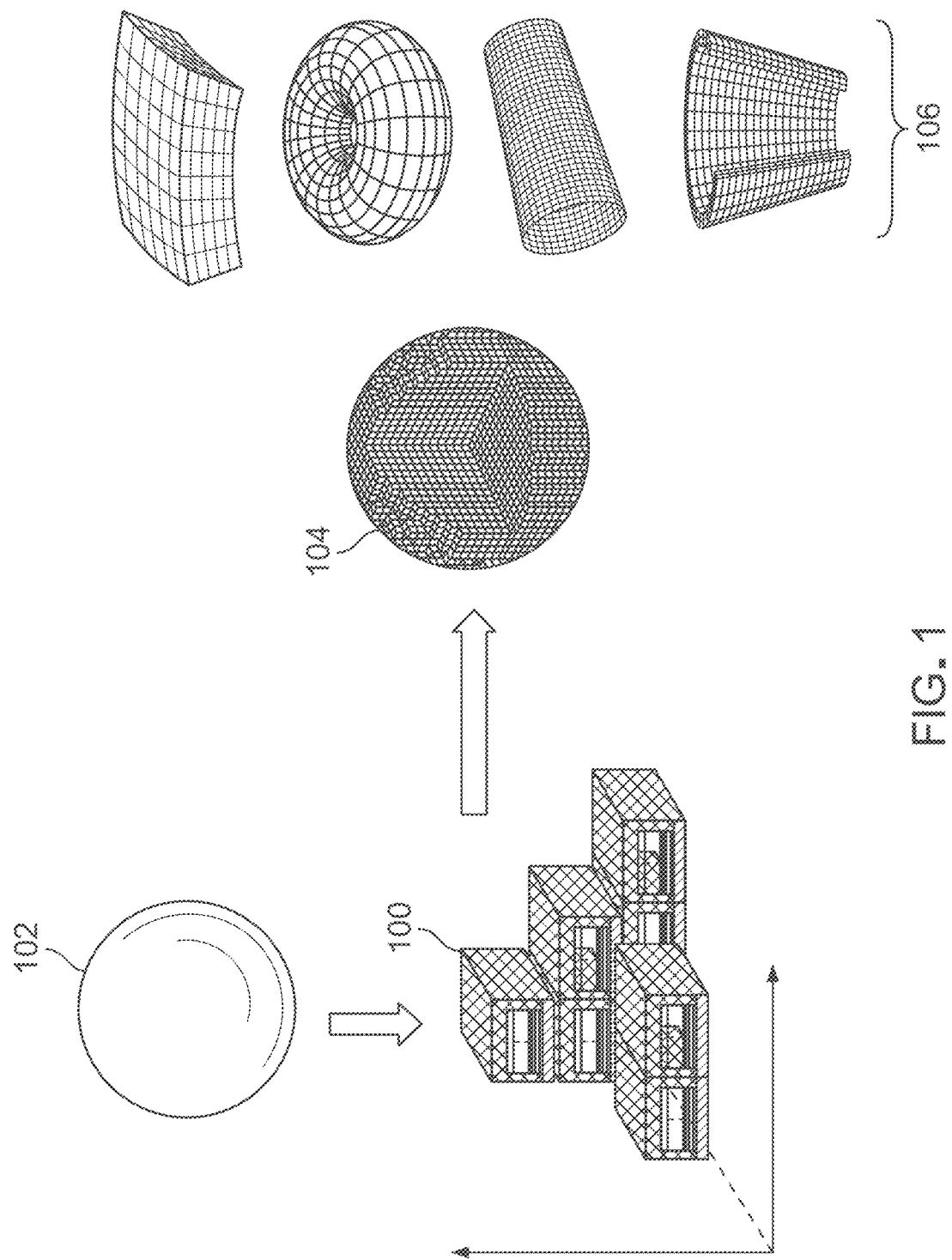
FIG. 1 is a schematic diagram of an example design process.

FIG. 1 illustrates a conceptual overview to approaches to forming a device, system, or sub-system (the "target device") having a specified geometry (e.g., size and shape) and functionality by manufacturing, e.g., additive manufacturing, of an assembly of component voxels. A representation 102 of the geometry of the target device (here, a sphere) is discretized into a set of volumetric units. Each volumetric unit is embodied physically as a component voxel 100, which is a 3D physical building block having defined geometry and defined functionality. Multiple component voxels are assembled to form the target device 104. The component voxels 100 that constitute the target device 104 can include multiple materials, electronic interconnection networks, fluidic interconnection networks, active or passive devices, or any appropriate combination thereof, to implement the functionality of the target device.

A component voxel is a three-dimensional (3D) physical (e.g., tangible) building block having defined geometry (e.g., size and shape), defined functionality, and defined material specification and distribution, that is mapped to a corresponding volumetric element of a target device. Although the component voxels 100 are shown as cubic elements in FIG. 1, component voxels in general can take on any geometry (e.g., any three-dimensional shape) appropriate to achieve geometry of the target device and to implement the functionality of the target device. For instance, the shape of a component voxel can be cubic, spherical, pyramidal, cylindrical, tetrahedron, quadrilateral pyramid, triangular prism, hexahedron, or other shape. In some examples, all component voxels of a target device have the same geometry; in some examples, one or more component voxels of a target device have a geometry different from the geometry of one or more other component voxels of the target device. In some examples, a component voxel can appear to be an approximately flat (e.g., near two-dimensional) structure; in the design specification, such a component voxel is represented as a 3D component voxel having an incrementally small third dimension. Moreover, component voxels can be assembled to achieve a wide range of geometries for the target device; example shapes 106 are shown in FIG. 1, and other shapes are also possible. In some examples, a conformal surface is layered over the set of component voxels of the target device, e.g., to compensate for the coarse-grained component voxel structure and produce a smooth surface texture.

Each component voxel in the assembly that makes up the target device can have a unique geometry, material composition and distribution, functionality, or combination thereof to satisfy feature, function and performance criteria. In some examples, one or more component voxels in the assembly can have equivalent structure, equivalent functionality, or both. A design specification for the target device is defined in terms of a physical specification (e.g., the geometry of the target device), mechanical specification (e.g., internal stresses, expected externally applied stresses or loads), specification of functionality (e.g., electronic, magnetic, optical, fluidic, or other functionality), thermal specification (e.g., heat transfer or power dissipation properties), materials specification (e.g., material properties, distribution of materials), or a combination of multiple such specifications. Volumetric elements, and corresponding component voxels, are mapped to the one or more design specification(s) and solved for (e.g., simultaneously), with each component voxel having a geometry, a material composition, and a functionality that enables the assembly of component voxels collectively to satisfy the design specification of the target device. Generally, the geometry of the component voxels that make up a target device can be optimized to conform to the specified geometry of the target device. In some examples, component voxels can be designed to optimize maximum component voxel size or minimum number of component voxels sufficient to achieve the design specifications, e.g., the geometry, material properties and distribution of materials, mechanics, thermal, and functionality of the target device.

A target device composed of component voxels can be manufactured by an additive manufacturing process that makes use of a combination of one or more additive manufacturing techniques such as 3D printing (e.g., single-axis or multi-axis 3D printing), layer-by-layer deposition, spray coating, lithographic, thin film deposition and patterning techniques, assembly by robotic or actuated tools (e.g., pick-and-place assembly), or other additive manufacturing techniques. Additional manufacturing processes, such as curing (e.g., ultraviolet curing or heat curing), milling, sintering, laser ablation, or other processes can be used in combination with one or more additive manufacturing techniques to manufacturing the target device. The target device can be formed by assembling one component voxel at a time or multiple component voxels at a time.

Figure 2:
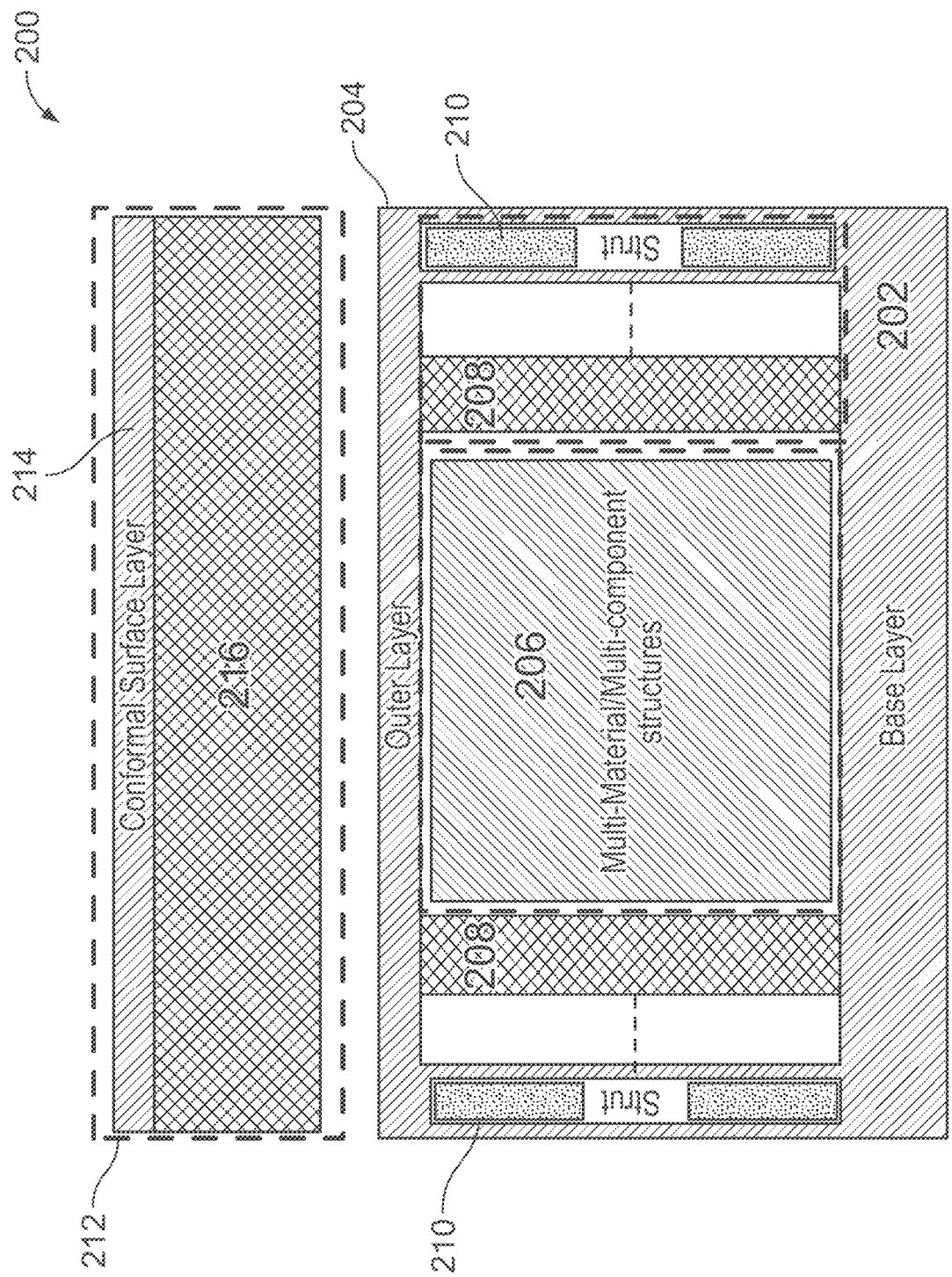
FIG. 2 is a diagram of an example component voxel.

FIG. 2 shows a cross-sectional view of an example component voxel 200. The component voxel 200 includes a base layer 202 on a first side of the component voxel 200, and an outer layer 204 on a second side opposite the first side. The base layer 202 and outer layer 204 can utilize any material appropriate to the structure and function of the component voxel 200, e.g., ceramics, polymers, resins, rigid or flexible materials, fluid permeable or impermeable materials, composites (e.g., materials with integral carbon fiber, Kevlar® or fiberglass), nanomaterials, metals, or other types of materials. An interior space 206 of the component voxel 200 is defined in a volume adjacent to the base layer 202 and the outer layer 204. In the example of FIG. 2, the interior space 206 is between the base layer 202 and the outer layer 204. The interior space 206 is an addressable, 3D space within which devices or elements can be disposed or fabricated to achieve a desired functionality for the component voxel 200, either alone or in combination with devices or elements in one or more other component voxels. Although the base layer 202 is shown on the bottom surface of the component voxel 200, one or more other surfaces of a component voxel can be defined as the base layer, as discussed below with reference to FIGS. 16-18. In this manner each surface within a component voxel may include a different material, may enable a functionality, and/or may have a different structure.

Structural elements including infill patterns, such as a lattice structure 208, a strut structure 210, or both, provide structural integrity to the component voxel 200. In some examples, lattice structures 208, strut structure 210, or both can be positioned in component voxels in positions other than those shown in FIG. 2. The structural integrity of a component voxel refers to the ability of the component voxel to maintain a fixed shape and to withstand application of a specific force during operation or transport of the target device in its intended environment. In some examples, as discussed below, structural elements also provide a framework for the implementation of interconnected networks that span multiple component voxels, such as conductive networks or fluidic networks (e.g., for fluid flow such as for thermal management or microfluidic purposes).

The example component voxel 200 also includes a surface structure 212 including a conformal surface layer 214 with an underlying lattice structure 216. In some examples, a surface structure can include only a conformal surface layer 214 without an underlying lattice structure. Surface structures 212 can be disposed on the outer layer 204 of component voxels that are disposed at external surfaces of a target device, e.g., to smooth the external surface of the target device, thereby preventing the discretized nature of the component voxel structure from being visibly apparent on the surface of the target device. A surface structure 212 is not formed on interior component voxels that are disposed in an interior of the target device.

Each component voxel of a target device can have a corresponding functionality that contributes to implementation of the overall functionality of the target device. A component voxel can implement its functionality as a standalone unit or in combination with one or more other component voxels in the target device. A component structure (not shown) that is associated with (e.g., enables implementation of) the functionality of a given component voxel can be disposed in the interior space 206 of the component voxel or can be embedded (e.g., fully embedded or partially embedded) in an element of the component voxel, such as embedded in the base layer 202, outer layer 204, lattice structure 208, or strut structure 210 of the component voxel. Each component voxel can have one or more than one component structure.

A component structure can be a device, such as an electronic device, magnetic device, optical device, microfluidic device, or another type of device. A component structure device can be a surface mount device (SMD) that is disposed on a surface (such as on the interior surface of the base layer of the component voxel) or embedded into a base or outer layer of the component voxel. A component structure can be an embedded device that is fully embedded or partially embedded in an element of the component voxel. The device can be a passive device, such as a coil, multi-coil, antenna, capacitor, inductor, resistor, or other passive device. The device can be an active device, such as a computer; microprocessor; system-on-a-chip (SoC) device; field programmable gate array (FPGA); memory; digital logic; mixed signal or analog integrated circuit such as op-amps, amplifiers, filters, oscillators, mixers, transistors, low-frequency, radio frequency (RF) or microwave or other analog devices; pump; valve; mixer; switching assembly; fan; power system; or other types of active device. In some examples, the component structures in multiple component voxels together function as an active or passive device.

A component structure can be an electrically conductive element, such as an electrically conductive line or wire. Electrically conductive elements (referred to herein as "conductive elements") of multiple component voxels can be interconnected to form a conductive network, e.g., for transmission of power, signals, or both. Conductive elements can be formed of a material that can conduct current, such as a metal, conductive ceramic, conductive polymer, conductive nanoparticle- or microparticle based material, or other conductive material. A component structure can be an electrically insulating element, e.g., to electrically insulate conductive elements from one another. Electrically insulating elements (referred to herein as "insulating elements") can be formed of a material that is insulating, such as an insulating ceramic, insulating polymer, insulating oxide, insulating nanoparticle- or microparticle-based material, or other insulating material. A component structure can utilize any appropriate material whose distribution is optimized with chemical, structural, thermal, optical, electrical, or magnetic properties that satisfy the component structure functionality and performance criteria.

In some examples, devices are fabricated external to the component voxel and placed into the interior of the component voxel to implement a given component structure, e.g., by robotic assembly, pick-and-place, or other assembly approaches. For instance, devices fabricated external to a component voxel can include integrated circuits, SoC devices, components to be assembled onto printed circuit boards, connectors such as jacks or plugs, or other devices. Externally fabricated devices can be interconnected with other component structures in a component voxel, e.g., by pad bonding to conductive structures or circuitry in the component voxel. In some examples, devices are fabricated within a component voxel. For instance, devices fabricated within a component voxel can include coils, inductors, resistors, energy storage devices, batteries, or other devices. In some examples, a device can include both internally fabricated and externally fabricated elements. Conductive and insulating elements are fabricated by deposition of materials during fabrication of the component voxel, e.g., by 3D printing, thin film deposition and patterning processes, or other approaches to materials deposition. For instance, conductive and insulating elements can be fabricated by depositing metals, dielectric materials, polymers, gels, inks, pastes, nanomaterials, or other materials. In some example, conductive elements and interconnection networks can be fabricated by depositing nanoparticle-based inks or pastes.

A component structure can be a channel that can interconnect with other channels within the same component voxel or across component voxels to form a manifold that can be part of a fluidic network. Channels or manifolds can be designed to support fluid (e.g., gas or liquid) flow, e.g., as part of a thermal management system or a microfluidics system. Channels or manifolds for thermal management can support flow of cooling fluid, e.g., a gas or liquid, to remove excess heat generated by devices or to thermally isolate devices from one another. Channels or manifolds for thermal management can be designed based on the expected generation of heat by component structures of the target device. Channels or manifolds that form part of a microfluidic network can support fluid flow in conjunction with operation of microfluidic devices such as pumps, mixers, valves, or other devices. In some examples, conductive elements, insulating elements, or devices can be disposed within the interior space of a channel or manifold. For instance, conductive elements can be disposed within channels or manifolds that define a fluidic network such that an electrical interconnection network follows the same topology as the fluidic network, e.g., enabling efficient cooling of the electrical interconnection network.

A component voxel can have one or multiple component structures. Component structures can be stacked on top of one another to create other component structures (e.g., multi-layer composite structures), e.g., active or passive elements such as N-turn coils, capacitors, antenna, resistors, complex embedded electronic or computer device systems, or other elements. For instance, a capacitor can be formed by sandwiching an insulating element between two conductive elements.

A number of examples of component voxels are described below. However, the geometry and functionality of component voxels is configurable to match the design specifications of a given target device, and thus component voxels can take on geometries and functionalities other those described below.

FIGS. 3A-3F show cross-sectional views of example component voxels 300a-300f. Each component voxel has a base layer 302a-302f (collectively referred to as base layer 302) and an outer layer 304a-304f (collectively referred to as outer layer 304), with an interior space 306a-306f (collectively referred to as interior space 306) defined in a volume adjacent to the base layer 302 and the outer layer 304, e.g., between the base layer 302 and the outer layer 304. The component voxels of FIGS. 3A-3F have various arrangements of component structures that are disposed in the interior space 306, embedded in the base layer 302, embedded in the outer layer 304, or a combination of any two or more of them. A component structure that is embedded in the base layer 302 can be fully embedded such that a top surface of the component structure is flush with a top surface of the base layer 302 (e.g., the surface of the base layer 302 that faces the interior space 306) or such that the top surface of the component structure is below the top surface of the base layer 302. Alternatively, or additionally, a component structure that is embedded in the base layer 302 can be partially embedded such that a portion of the component structure is in the interior space 306 and a portion is in the base layer 302. The component structures in the component voxels 300a-300f include active and passive devices (depicted in blue), conductive elements (depicted in red), and insulating elements (depicted in yellow). In some examples, the interior space 306 is empty other than the component structures disposed therein. In some examples, the interior space 306 is filled with a material, such as a lattice structure or strut structure.

Figure 3A:
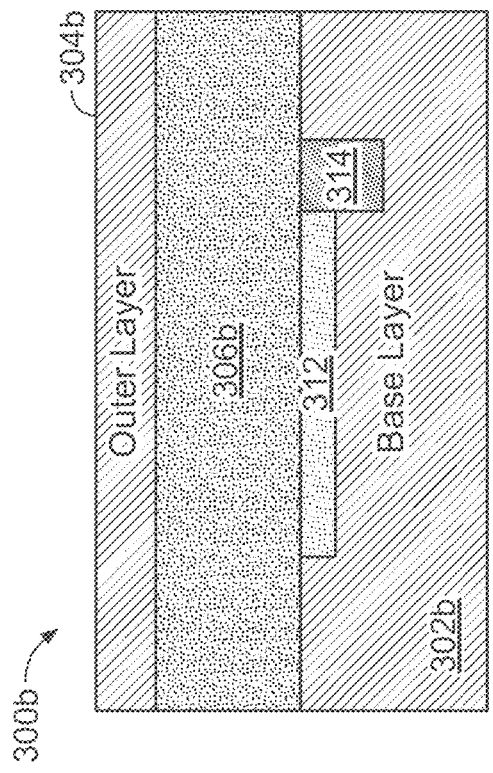
Figure 3B:
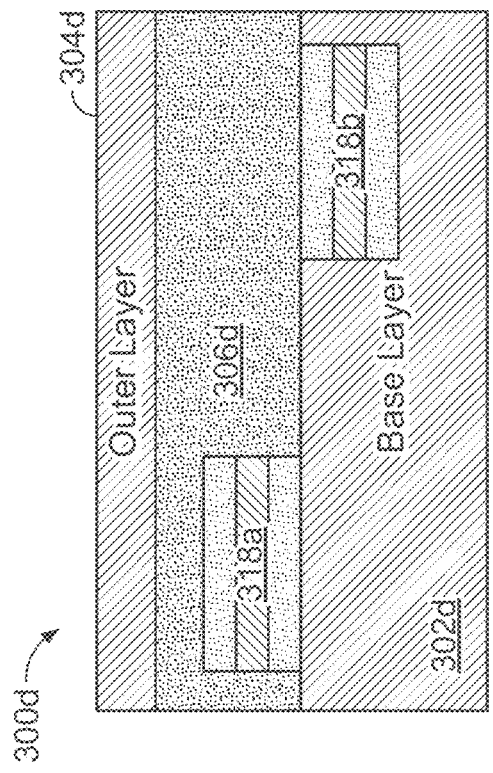

Referring specifically to FIG. 3A, the component voxel 300a includes a device 310, e.g., an active or passive device; and a conductive element 308, e.g., that forms part of a conductive network spanning multiple component voxels. The conductive element 308 and device 310 are disposed in the interior space 306a of the component voxel 300a, on the interior surface of the base layer 302a. Referring to FIG. 3B, the component voxel 300b includes an active or passive device 314, e.g., an active device such as an integrated circuit or SoC, or SMD resistor or capacitor passive device, or other type of active or passive device and a conductive element 312, e.g., that forms part of a conductive network spanning multiple component voxels. The conductive element 312 and device 314 are embedded in the base layer 302b. The conductive elements 308, 312 of the component voxels 300a, 300b each can form part of a respective electrical interconnection network that spans multiple component voxels.

Figure 3C:
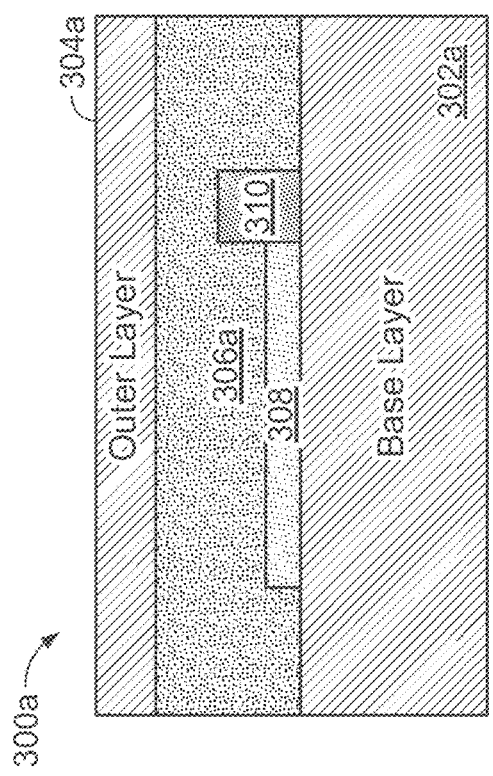

Referring to FIG. 3C, the component voxel 300c includes a first composite structure 316a disposed in the interior space 306c of the component voxel 300c, on the interior surface of the base layer 302c. The component voxel 300c also includes a second composite structure 316b embedded in the base layer 302c. Each composite structure 316a, 316b is a multilayer composite structure formed of a conductive element disposed between insulating elements. The composite structures 316a, 316b can be active or passive elements or can form part of an electrical interconnection network that spans multiple component voxels.

Figure 3D:
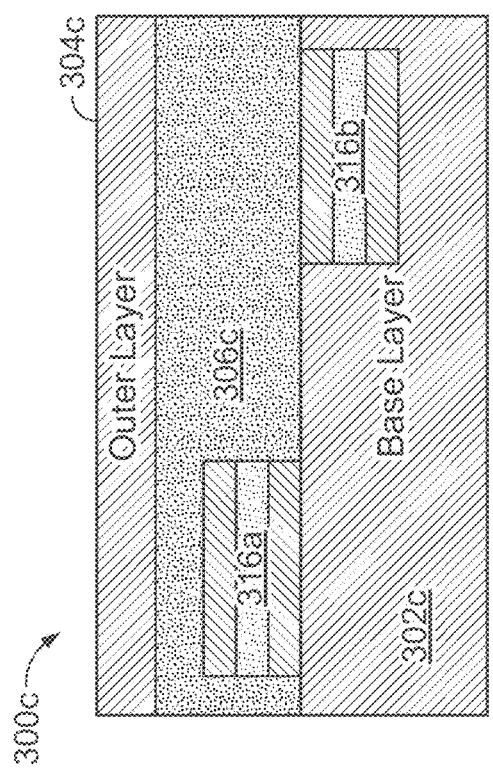

Referring to FIG. 3D, the component voxel 300d includes a first composite structure 318a disposed on the interior surface of the base layer 302d and a second composite structure 318b embedded in the base layer 302d. Each composite structure 318a, 318b is a multilayer composite structure formed of an insulating element disposed between conductive elements. The composite structures 318a, 318b can be active or passive elements, e.g., capacitors or ground planes. The composite structures 318a, 318b can form part of an electrical interconnection network that spans multiple component voxels.

Referring to FIG. 3E, the component voxel 300e includes a composite structure 328a partially embedded into the base layer 302e, a composite structure 328b fully embedded into the base layer 302e, and a composite structure 328c disposed in the interior space 306e of the component voxel 300e, on the interior surface of the base layer 302e. Each composite structure 328a-328c includes a conductive element and an insulating element. The composite structures 328a-328c can be active or passive elements or can form part of an electrical interconnection network that spans multiple component voxels.

Referring to FIG. 3F, the component voxel 300f includes an insulating element 334a and a conductive element 336a disposed in the interior space 306f of the component voxel 300f, on the interior surface of the base layer 302f. The component voxel 300f also includes an insulating element 334b and a conductive element 336b embedded in the base layer 302f.

FIGS. 4A-4G are cross-sectional view of example component voxels 400a-400g having more complex composite structures. Each component voxel 400a-400g has a base layer 402a-402g and an outer layer 404a-404g, with an interior space defined in a volume adjacent to the respective base layer and outer layer, e.g., between the respective base layer and outer layer. As discussed below, one or more composite structures are disposed in the interior space of each component voxel 400a-400g. The composite structures can be active or passive devices, or active or passive elements formed from conductive and/or insulating elements, or can form part of electrical interconnection networks that span multiple component voxels.

Figure 4A:
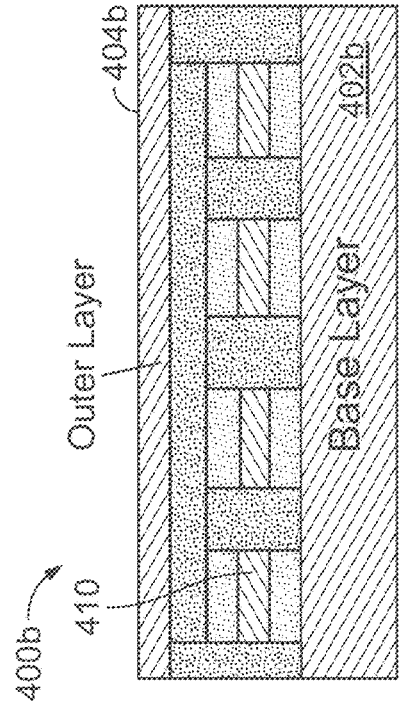
Figure 4B:
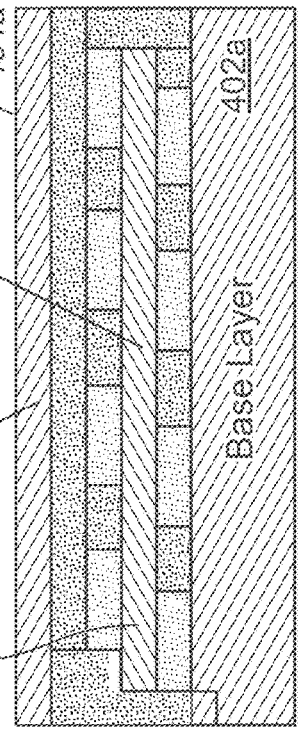

Referring specifically to FIG. 4A, a composite structure 408 in the component voxel 400a is a two-layer conductive geometry having two layers of conductive elements, with a continuous insulating element disposed between the two layers. In some examples, a similar pattern of alternating layers of conductive elements and continuous insulating elements can be repeated for additional layers. Referring to FIG. 4B, the component voxel 400b includes composite structures 410, each of which forms a two-layer conductive geometry, with each composite structure being formed of an insulating element disposed between conductive elements. Fluidic channels are formed between each pair of adjacent composite structures.

Figure 4C:
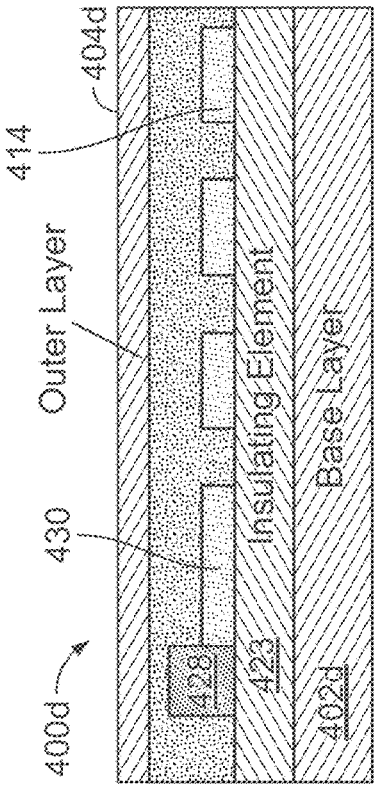
Figure 4D:
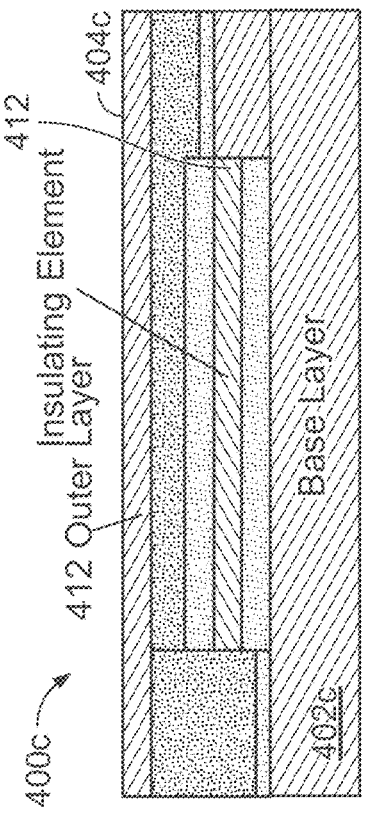

Referring to FIG. 4C, the base layer 402c of the component voxel 400c has a stepped profile. A composite structure 412 spanning the step of the base layer 402c includes two overlapping conductive elements separated by an insulating element, e.g., to form a capacitor. Referring to FIG. 4D, component voxels 400d includes a composite structure 414 that has a device 428 and multiple conductive elements disposed on an insulating element 432. For instance, the device 428 can be an integrated circuit and a conductive element 430 can act as an interconnection to a one or more pads of the integrated circuit. Referring to FIG. 4E, the component voxel 400e has conductive elements disposed on an insulating element 434, with a conductive element 436 formed as an interconnection to a device 438, such as an integrated circuit.

Referring to FIG. 4F, the component voxel 400f includes a composite structure 420 including insulating elements, conductive elements, a device 440a embedded in the base layer 402f of the component voxel 400f, and a device 440b disposed on an interior surface of the base layer 402f. Conductive elements 442a, 442b are formed as interconnections to the respective devices 440a, 440b. Vias interconnect conductive elements of the composite structure 420, e.g., conductive elements separated by insulating elements. For instance, such a multi-layer structure can be an N-turn coil. Referring to FIG. 4G, the component voxel 400g includes multiple devices 424 embedded in the base layer 402g, with conductive elements 426 forming interconnections to each device 424.

FIGS. 5A-5D show example component voxels 500a-500c in which channels are defined within a base layer 502a-502c, an outer layer 504a-504c, or both. The channels together can form one or more manifolds can form part of a fluidic network that spans multiple component voxels. The fluidic network can be used for thermal management, e.g., to provide a pathway for circulation of cooling fluid or for removal of heat so as to maintain a stable operating temperature environment for components within a device. The fluidic network can be used for implementation of a microfluidic functionality of the target device. Conductive elements can be disposed in the channels to form part of an electrical interconnection network that follows the topology of the fluidic network.

Referring specifically to FIG. 5A, the component voxel 500a (shown in cross-sectional view) includes input/output channels 508a formed in the base layer 502a. In the component voxel 500b of FIG. 5B (shown in cross-sectional view), input/output channels 508b are formed in the outer layer 504b. FIGS. 5C and 5D show cross-sectional and top views, respectively, of the component voxel 500c, in which input/output channels 508c, 508d are formed in both the base layer 502c and the outer layer 504c. Other configurations (e.g., size, location, or both) of channels can also be used.

In some examples, a lattice structure, a strut structure, or both can be used for mechanical support of a component voxel, e.g., to provide structural integrity against externally applied load-bearing forces or stresses, such as forces or stresses applied by other component voxels assembled over a given component voxel or by an external object or the environment. A lattice structure is a sparse structure that extends from one interior surface to another interior surface in a component voxel. A strut structure is a solid element that extends from one interior surface to another interior surface in a component voxel. Structural elements such as lattice structures and strut structures are generally disposed normal to a surface of the component voxel, such as normal to the base layer, the outer layer, or an internal layer of the component voxel, to provide mechanical support. In some examples, a strut structure, a lattice structure, or both can support interconnection among neighboring component voxels, or for other purposes. For instance, channels or manifolds can be formed through a strut structure, a lattice structure, or both, e.g., to provide fluid flow pathways or through which an electrical interconnection network can be established. In some examples, devices, conductive elements, insulating elements, or a combination thereof can be disposed in a strut structure, a lattice structure, or both. The material composition and distribution of a lattice structure, a strut structure, or both can vary in any of density, material characteristics and geometry in order to optimize for the design, performance, and environmental requirements.

Figure 6A:
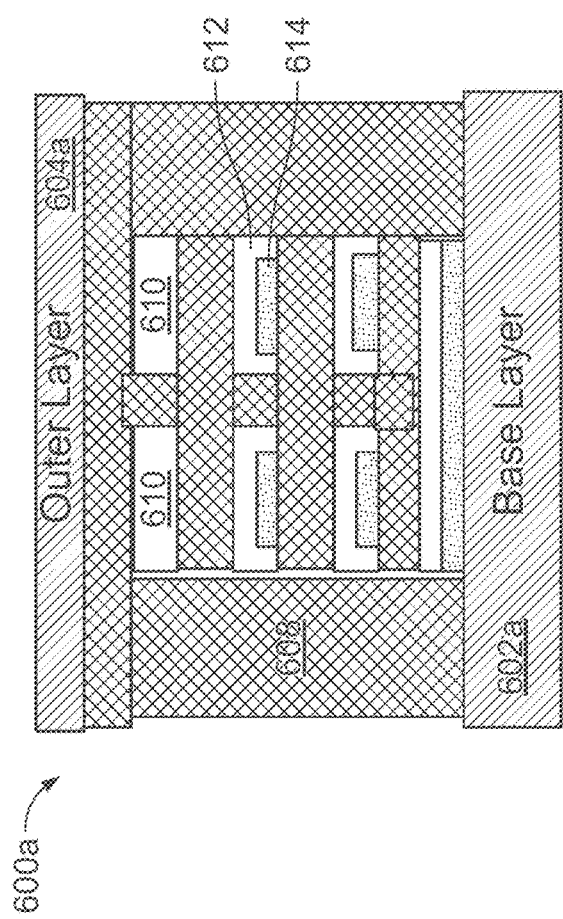
FIGS. 6A and 6B are diagrams of example component voxels.

FIG. 6A illustrates a cross sectional view of an example component voxel 600a with a base layer 602a and an outer layer 604a, with a lattice structure 608 disposed in the interior space of the component voxel 600a. Channels or manifolds are defined through the lattice structure 608. A first set of manifolds 610 is defined through the lattice structure 608 to form part of a fluidic network, e.g., to enable thermal management or to enable microfluidics functionality. A second set of manifolds 612 is defined through the lattice structure 608 for fluid flow, and to support conductive elements 614 disposed in the manifolds 612 for electrical interconnection between the component voxel 600a and other component voxels.

Figure 6B:
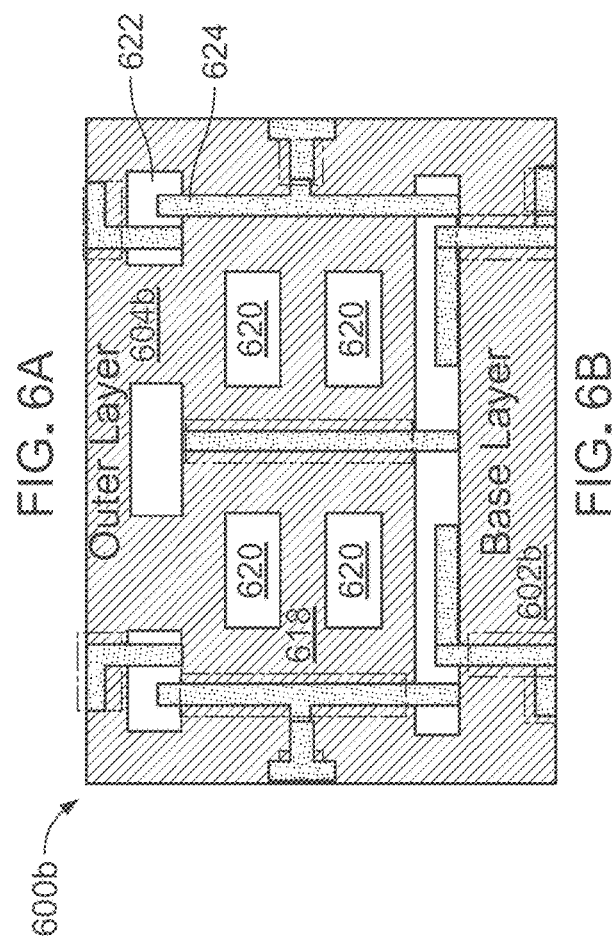

FIG. 6B illustrates a cross sectional view of an example component voxel 600b with a base layer 602b and an outer layer 604b, with a strut structure 618 disposed in the interior space of the component voxel 600b. Channels or manifolds are defined through the strut structure 618. A first set of manifolds 620 is defined through the strut structure 618 to form part of a fluidic network, e.g., to enable thermal management or to enable microfluidics functionality. A second set of manifolds 622 is defined through the strut structure 618 for fluid flow, and to support conductive elements 624 disposed in the manifolds 622 for electrical interconnection between the component voxel 600b and other component voxels. The conductive elements 624 extend through a portion of the strut 618.

Figure 7A:
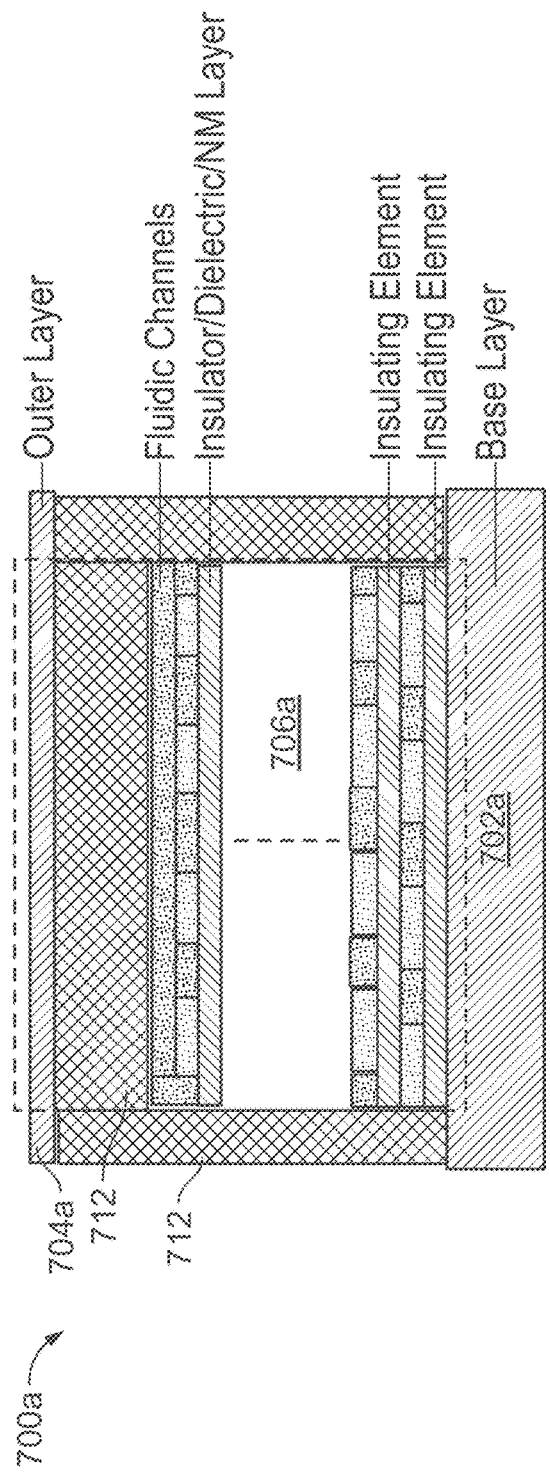
FIGS. 7A and 7B are diagrams of example component voxels.
Figure 7B:
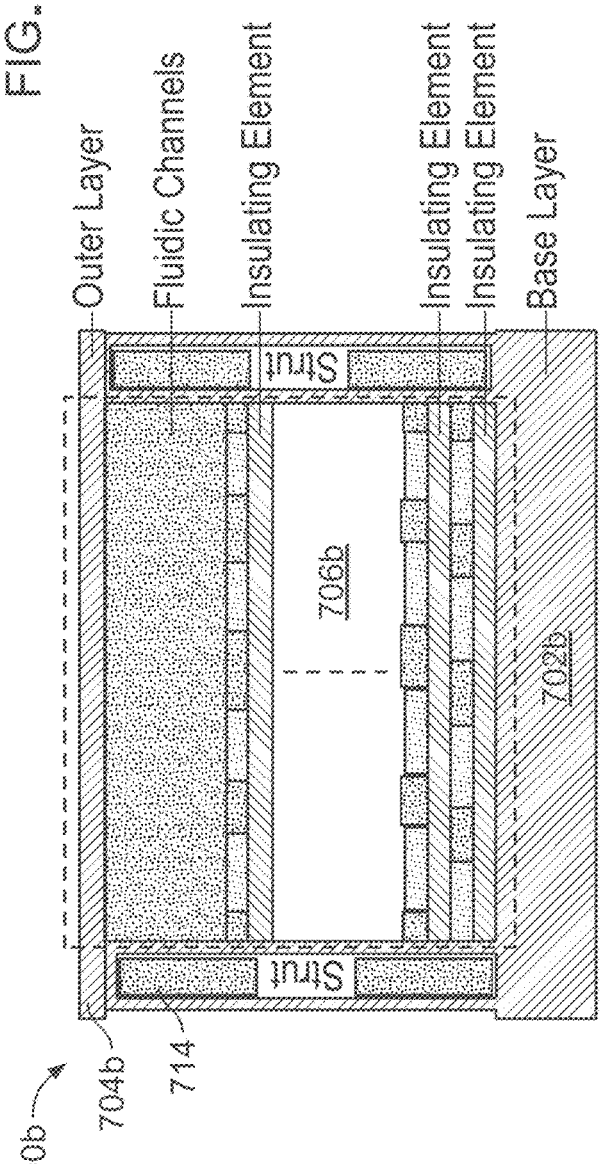

Referring to FIGS. 7A and 7B, a component voxel can have any number of layers of devices, conductive elements, insulating elements, and manifolds appropriate to carry out its associated function, e.g., subject to compatibility with structural and interconnection criteria. As shown in FIG. 7A, a component voxel 700a having a base layer 702a, an outer layer 704a, and a lattice structure 712 includes multiple, alternating layers of insulating elements and conductive elements disposed in an interior space 706a of the component voxel 700a. For instance, the conductive elements can form part of an electrical interconnection network that spans multiple component voxels. As shown in FIG. 7B, a component voxel 700b having a base layer 702b, an outer layer 704b, and a strut structure 714 includes multiple, alternating layers of insulating elements and conductive elements disposed in an interior space 706b of the component voxel 700b, e.g., extending through a portion of the strut structure. In some examples, the multi-layer structures shown in FIGS. 7A and 7B can form a multi-layer active or passive element. In some examples, the lattice and strut structure can form part of a fluidic network that spans multiple component voxels.

Multiple component voxels can be assembled into an assembly to form a target device. In some examples, all component voxels of the assembly can have the same shape and size. In some examples, one or more component voxels of the assembly can have a shape, size, or both that is different from the shape or size of one or more other component voxels of the array. Component voxels can be assembled horizontally (e.g., side-by-side) or vertically (e.g., one on top of another). The orientation of a component voxel can be defined by the direction of a vector from the base layer to the outer layer of the component voxel. In some examples, all component voxels of the assembly can have the same orientation. In some examples, one or more component voxels of the assembly can have an orientation that is different from the orientation of one or more other component voxels of the assembly.

Figure 8A:
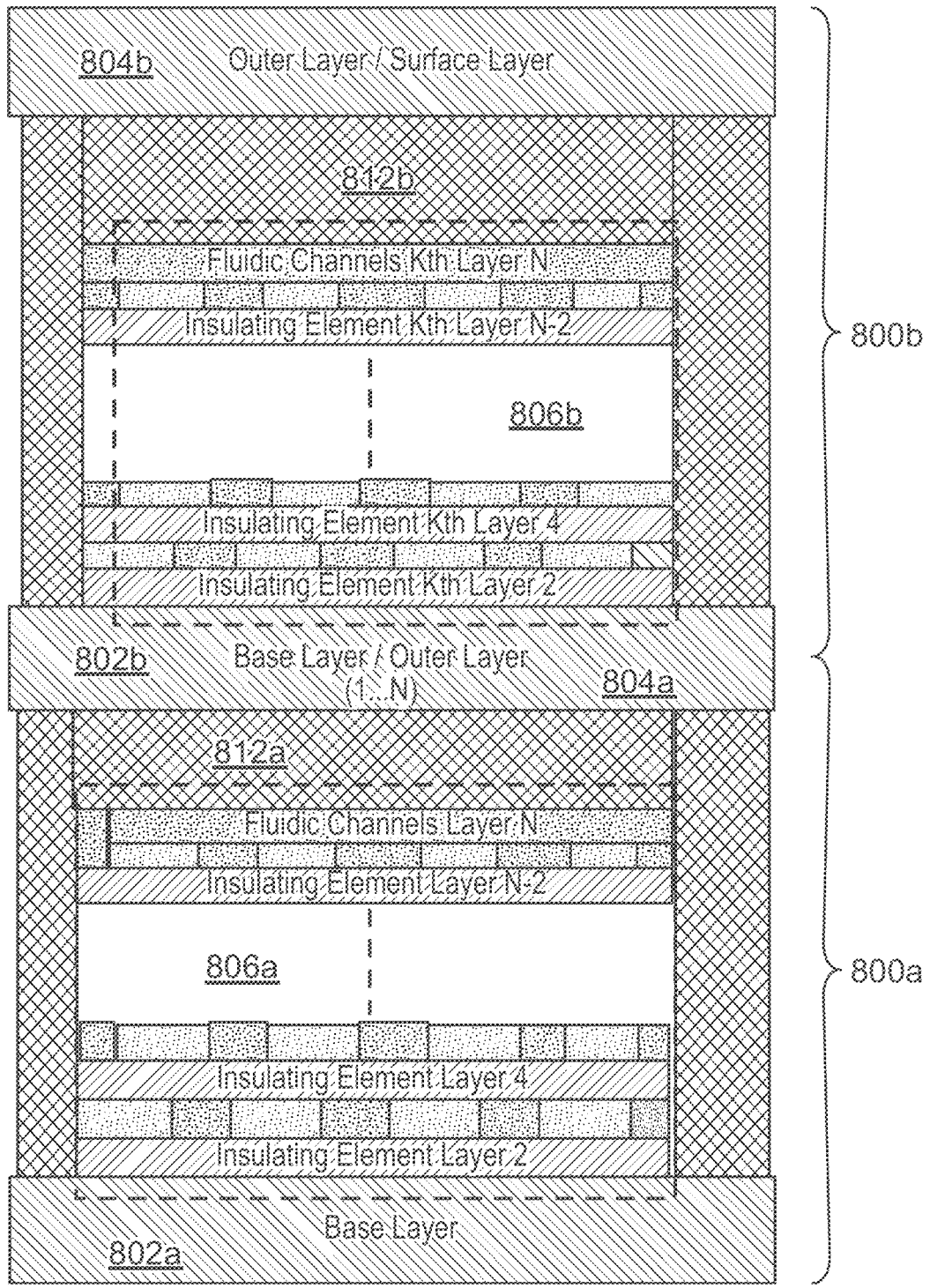
FIGS. 8A and 8B are diagrams of example assemblies of component voxels.

FIG. 8A illustrates an assembly of two component voxels 800a, 800b assembled vertically. The bottom component voxel 800a has a base layer 802a and an outer layer 804a, with an interior space 806a defined in a volume adjacent to the base layer 802a and outer layer 804a, e.g., between the base layer 802a and outer layer 804a. The top component voxel 800b has a base layer 802b and an outer layer 804b, with an interior space 806b defined in a volume adjacent to the base layer 802b and the outer layer 804b, e.g., between the base layer 802b and outer layer 804b. In the example of FIG. 8A, the base layer 802b of the top component voxel 800b and the outer layer 804a of the underlying component voxel 800a are the same layer. In some examples, the outer layer of an underlying component voxel is a distinct layer from the base layer of the component voxel above, e.g., a layer that is distinct in structure or material. Each component voxel 800a, 800b has a multilayer composite structure disposed in its interior space 806a, 806b. Each component voxel 800a, 800b also has a respective lattice structure 812a, 812b. Although the composite structures and lattice structures 812a, 812b are shown as being identical between the component voxels 800a and 800b, the component voxels of an assembly do not necessarily have the same internal components or the same functionality.

Figure 8B:
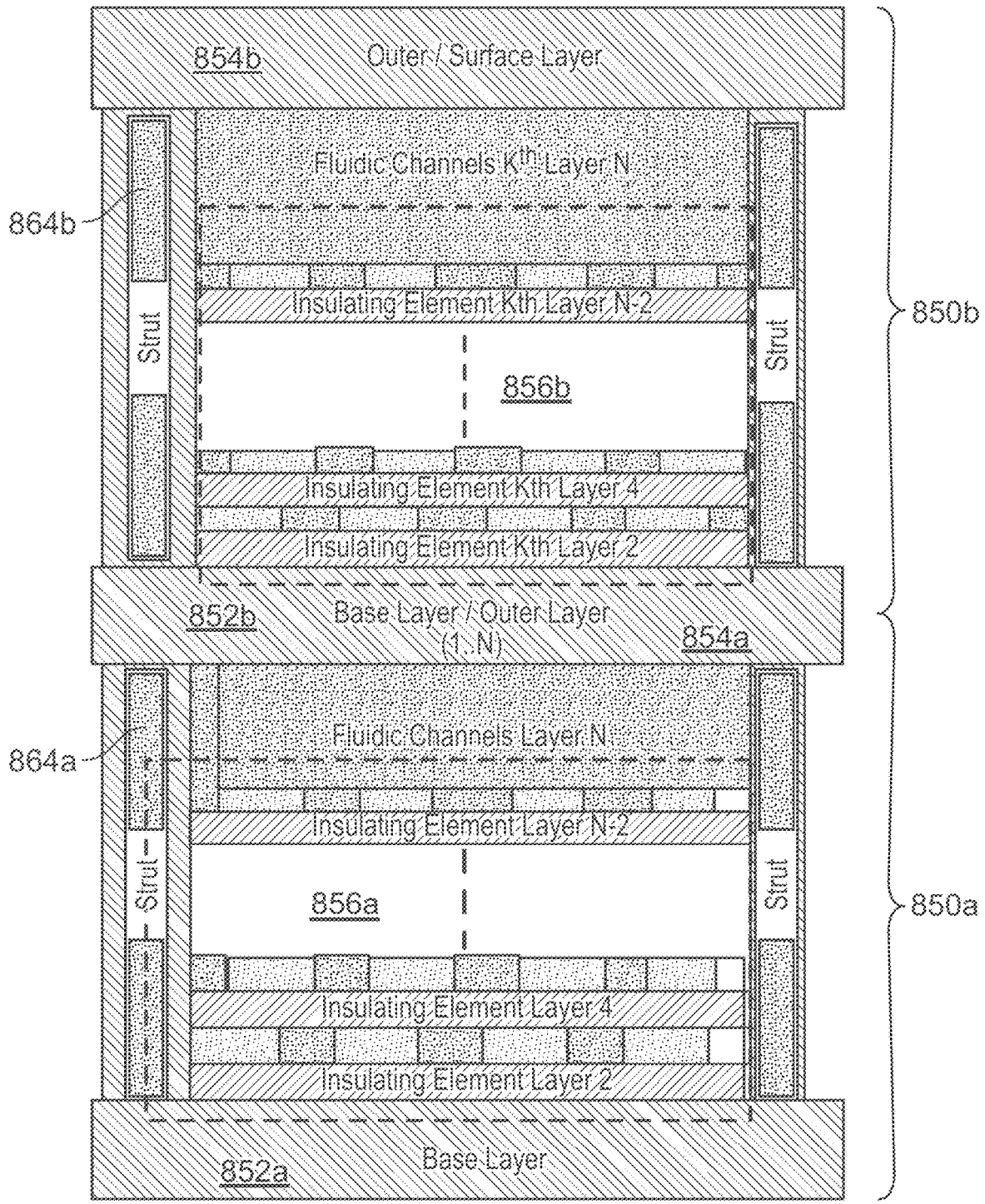

FIG. 8B illustrates an assembly of two component voxels 850a, 850b assembled vertically. The bottom component voxel 850a has a base layer 852a and an outer layer 854a, with an interior space 856a defined in a volume adjacent to the base layer 852a and the outer layer 854a, e.g., between the base layer 852a and outer layer 854a. The top component voxel 850b has a base layer 852b and an outer layer 854b, with an interior space 856b defined in a volume adjacent to the base layer 852b and the outer layer 854b, e.g., between the base layer 852b and outer layer 854b. In the example of FIG. 8B, the base layer 852b of the top component voxel 850a and the outer layer 854a of the underlying component voxel 850a are the same layer. In some examples, the outer layer of an underlying component voxel is a distinct layer from the base layer of the component voxel above, e.g., a layer that is distinct in structure or material. Each component voxel 850a, 850b has a multilayer composite structure disposed in its interior space 856a, 856b. Each component voxel 850a, 850b also has a respective strut structure 864a, 864b. Although the composite structures and strut structures 864a, 864b are shown as being identical between the component voxels 850a and 850b, the component voxels of an array do not necessarily have the same internal components or the same functionality.

The component voxels described above illustrate example configurations for component structures disposed in the interior space of the component voxel, embedded within a layer (e.g., the base layer or outer layer) of the component voxel, or both. The component voxels described above also illustrate the role of lattice and strut structures in providing structural integrity to a component voxel as well as providing a platform for placement of component structures. The component voxels described above additionally illustrate the role of lattice and strut structures in providing a framework for fluidic transport and thermal management for each of the component structures and the assemblage of all component structures inter-operating together, e.g., contributing to achieving the target device functionality and performance criteria. Component structures, lattice structures, and strut structures of a component voxel are not limited to the configurations described above.

In general, the geometry and functionality of each component voxel in an assembly that forms a target device are specified so as to achieve the geometry and functionality of the target device. In some examples, one or more component voxels in the assembly can be a generic component voxel (sometimes also called a "NULL" component voxel or an empty component voxel) for which the functionality, and thus the component structures, component voxel interconnections, or both, are not specified. Generic component voxels are configurable, e.g., by a user or by an automated design process, to implemented desired functionality, structural characteristics, or both, e.g., providing a framework for implementation of custom functionality in the context of the overall geometry and functionality of the target device. In a specific example, generic component voxels can be defined in specified locations to enable the integration of custom inputs or outputs, connector interfaces, that are contemplated in the overall design and may involve a customized design pattern, or to enable integration of devices that may not be able to be incorporated into the additive manufacturing process by which the component voxels are assembled.

Figure 9:
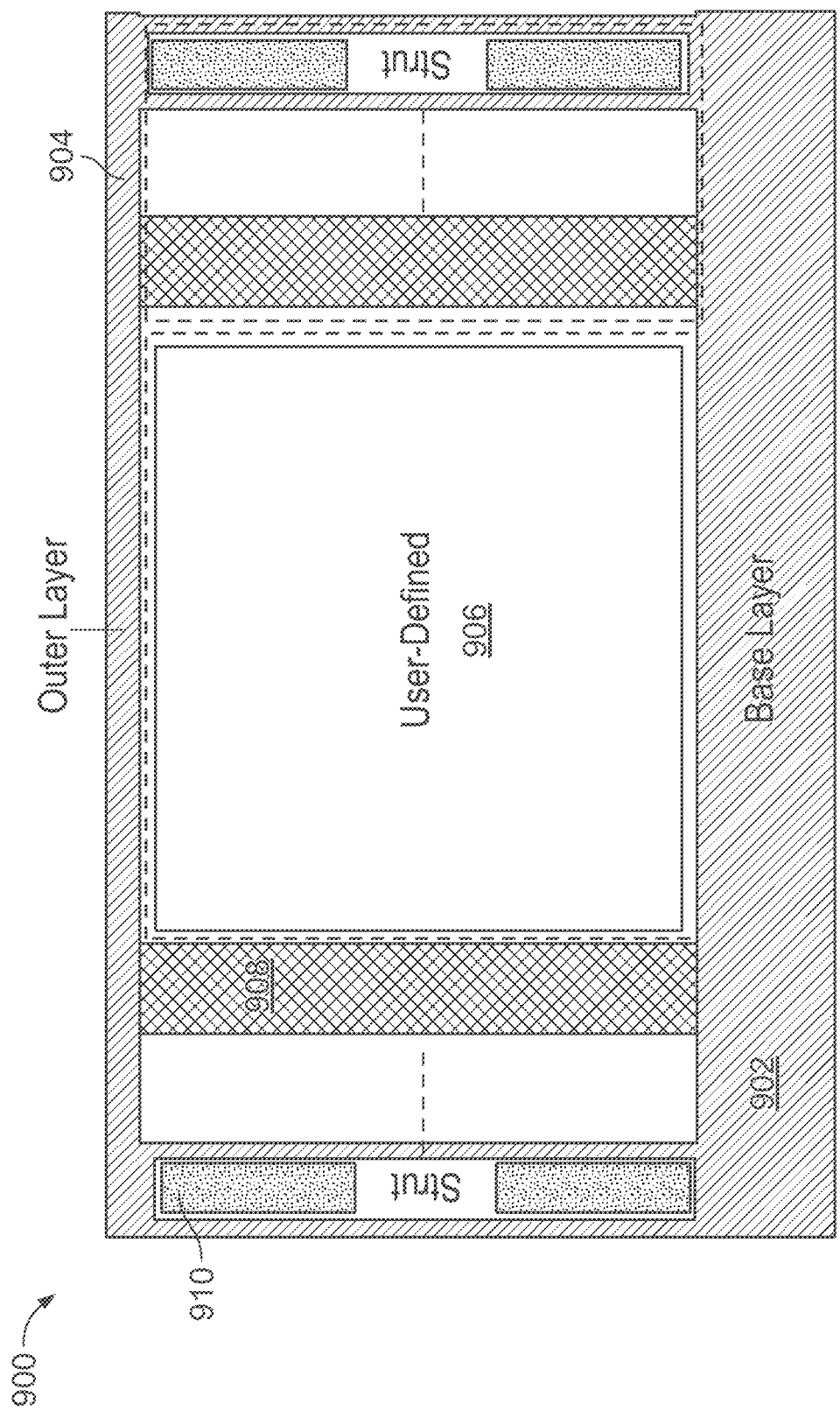
FIG. 9 is a diagram of an example generic component voxel.

Referring to FIG. 9, an example generic component voxel 900 includes a base layer 902 and an outer layer 904. In some examples, the base layer 902 of the component voxel 900 can serve as the outer layer of an underlying component voxel. An interior space 906 defined in a volume adjacent to the base layer 902 and the outer layer 904 (e.g., between the base layer 902 and the outer layer 904) can house one or more component structures to achieve the desired functionality of the component voxel 900. The component voxel 900 can include a lattice structure 908, a strut structure 910, or both, to achieve the desired structural or temperature characteristics, or both, of the component voxel; to provide a platform for component structures, or both. The placement of lattice and strut structures is not limited to that shown in FIG. 9; lattices, struts, or both can be positioned at appropriate locations within the interior space of the component voxel 900; can span the entire height of the component voxel 900 from the base layer 902 to the outer layer 904 or less than the entire height; and can span the entire width or less than the entire width of the component voxel 900. The configurable nature of the generic component voxel 900 provides a designer with flexibility to design component voxels as appropriate to achieve target structure, function, and design objectives.

FIGS. 10A-10K illustrate examples of assemblies 160a-160k of multiple component voxels in different stacking scenarios. Although the stacking scenarios of FIGS. 10A-10K are relatively simple, component voxels can be assembled according to stacking scenarios of arbitrary complexity so as achieve the geometry of the target device. Component voxels can be assembled horizontally (side-by-side) or vertically (the base layer of one on top of the outer layer of another), or both. All component voxels in an assembly can have the same orientation, or one or more component voxels can have an orientation different from the orientation of one or more other component voxels of the assembly. By orientation of a component voxel, we mean the direction of a vector that points from the base layer to the outer layer of the component voxel. Although the component voxels in FIGS. 10A-10K are shown as having the same component structures, one or more component voxels of an assembly can include component structures that are different from the component structures of one or more other component voxels of the assembly. Some or all of the component voxels in an assembly can be interconnected, e.g., electrically or fluidically. In the examples of FIGS. 10A-10K, a base layer 162a-162k of the respective assembly 160a-160k extends laterally beyond a lateral extent of the component voxels in the assembly. For instance, additional component voxels can be assembled elsewhere, e.g., on the base layer 162a-162k, such as component voxels provided for structural reasons or to provide a desired functionality.

FIGS. 10A-10D illustrate assemblies 160a-160d of component voxels stacked vertically. In the example of FIG. 10A, two component voxels each including a lattice structure are stacked vertically (e.g., such that the outer layer of the bottom component voxel contacts, or is the same layer as, the base layer of the top component voxel) to form the assembly 160a. In the example of FIG. 10B, two component voxels each including a strut structure are stacked vertically to form the assembly 160b. In the example of FIG. 10C, the assembly 160c includes four component voxels stacked vertically. In the example of FIG. 10D, the assembly 160d includes two columns of vertically stacked component voxels. A bold arrow that points toward the outer surface of the respective assembly 160a-160d represents the orientation of the assembly as a whole. As shown by the arrows, the orientation of the component voxels of the assemblies 160a-160d is coincident with the orientation of the respective assembly 160a-160d.

FIGS. 10E-10G show assemblies 160e-160g of stacked component voxels in which the orientation of the component voxels in the assembly is not the same as the orientation of the assembly itself. Referring specifically to FIG. 10E, in the assembly 160e, two component voxels, each including a lattice structure, are stacked vertically. Referring to FIG. 10F, in the assembly 160f, two component voxels, each including a strut structure, are stacked vertically. In the example of FIG. 10G, the assembly 160g includes two rows of vertically stacked component voxels. A bold arrow that points toward the outer surface of the respective assembly 160e-160g represents the orientation of the assembly as a whole. As shown by the arrows, the orientation of the component voxels of the assemblies 160e-160g is different from (e.g., orthogonal to) the orientation of the respective assembly 160e-160g.

Referring to FIGS. 10H-10K, in some examples, one or more component voxels in an assembly can have an orientation that is different from the orientation of one or more other component voxels in the assembly. Each of FIGS. 10H-10K shows an assembly 160h-160k including multiple component voxels, with the orientation of each assembly 160h-160k being shown by a bold arrow. In each assembly 160h-160k, some of the component voxels have an orientation that is the same as the orientation of the respective assembly 160h-160k, and other component voxels have an orientation that is different from the orientation of the respective assembly 160h-160k.

Figure 11:
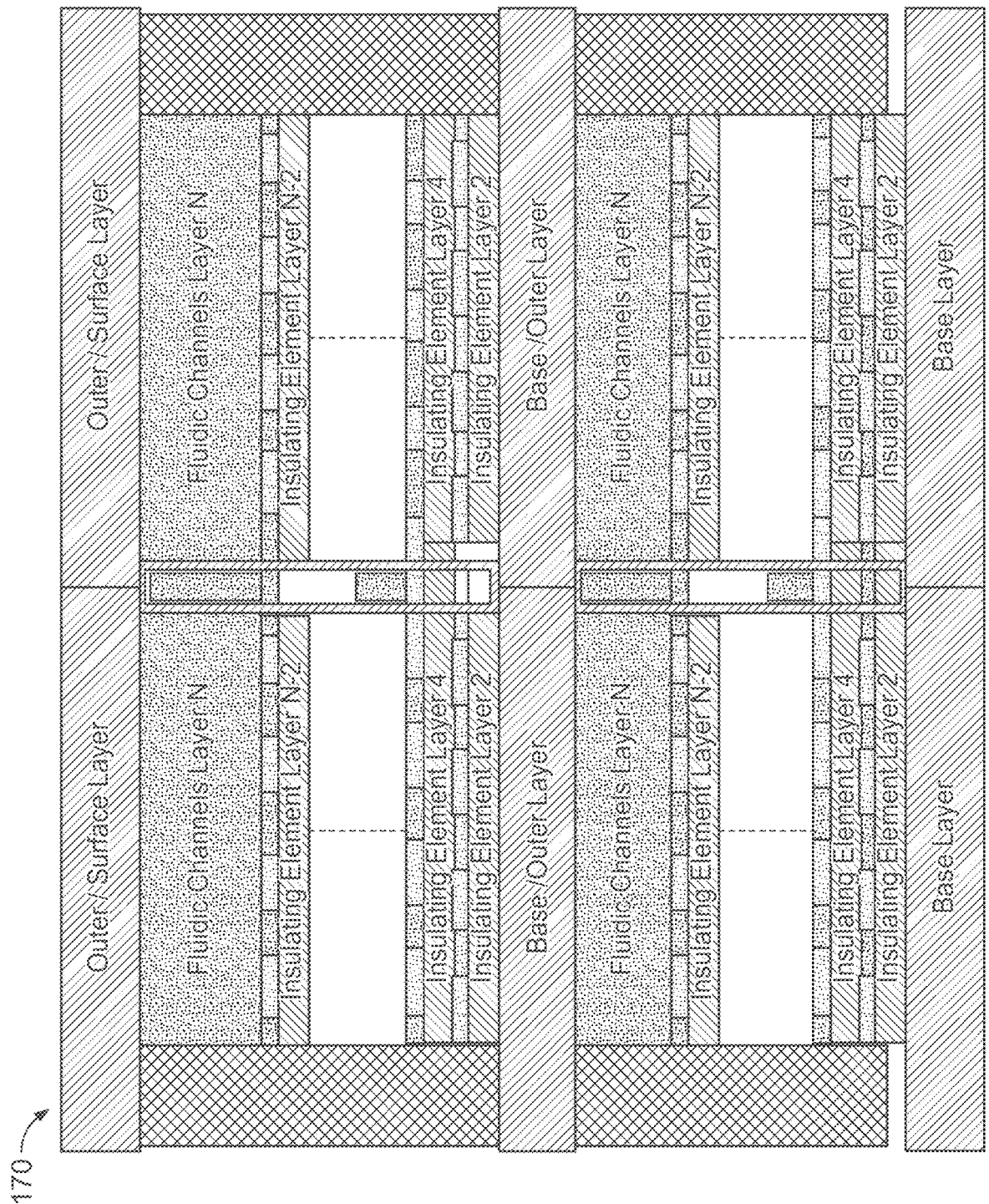
FIG. 11 is a diagram of an example assembly of component voxels.

Referring to FIG. 11, an assembly 170 of four component voxels are integrated structurally and functionally into a 2×2 matrix assembly, forming a cubic volume structure. In the example of FIG. 11, each component voxel includes a strut structure and lattice structure providing a framework for manifolds for a fluidic network and conductive interconnection networks among component voxels. Each component voxel also includes a multilayer composite structure including conductive elements and insulating elements. Although the component voxels of the assembly 170 are shown as having identical structure, other assemblies of component voxels can include one or more component voxels having a geometry, structure, or functionality, or combination thereof, that differs from one or more other component voxels of the assembly.

Figure 12A:
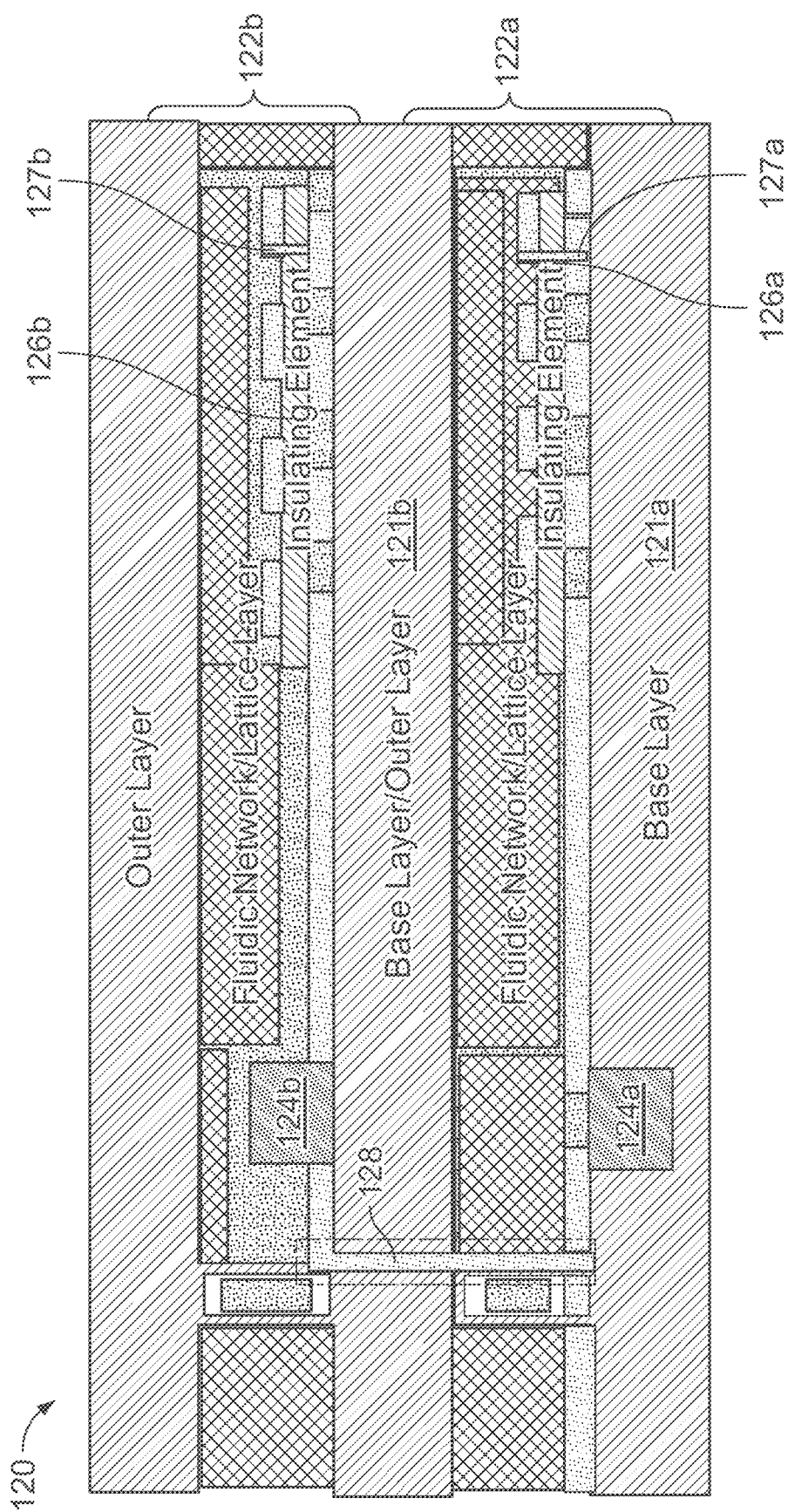
FIGS. 12A and 12B are diagrams of example assemblies of component voxels.
Figure 12B:
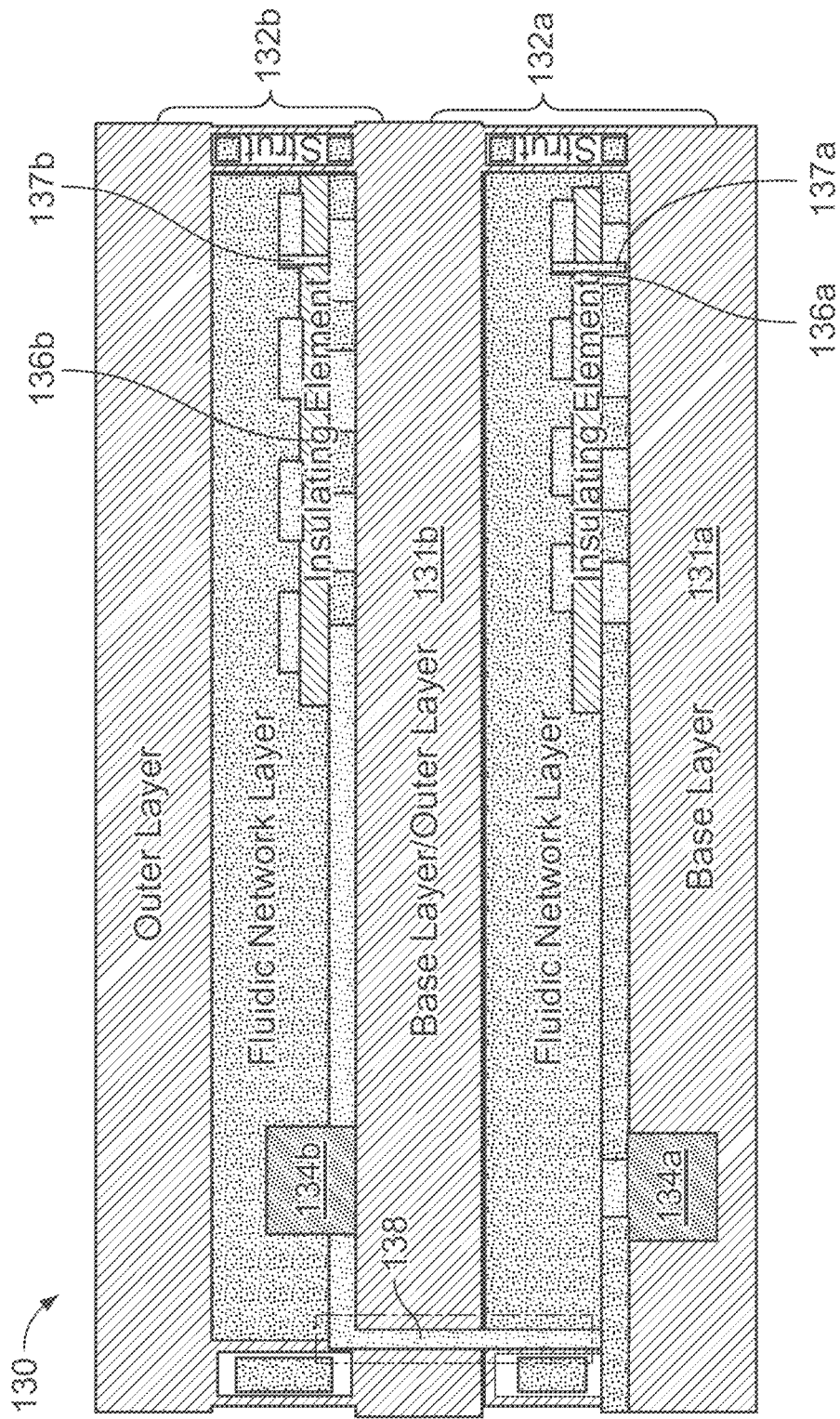

FIGS. 12A and 12B illustrate assemblies 120, 130 of two component voxels 122a-122b, 132a-132b, respectively (sometimes referred to collectively as component voxels 122, 132). Each of the component voxels 122, 132 has a device 124a-124b, 134a-134b (e.g., an active device, such as a surface mount device). The device 124a, 134a of the respective bottom component voxel 122a, 132a is embedded within the base layer 121a, 131a of the component voxel. The device 124b, 134b of the respective top component voxel 122b, 132b is disposed on the interior surface of the base layer 121b, 131b of the component voxel, e.g., in the interior space of the component voxel. Each component voxel 122, 132 also has a multilayer component assembly 126a-126b, 136a-136b including conductive and insulating elements disposed in the interior space of the respective component voxel. An conductive element 127a-127b, 137a-137b in each multilayer component assembly acts as an interconnection via that connects two layers of conductive elements that are separated by an insulating element to form a multilayer, passive device, such as a continuous, N-layer (here, 2-layer) coil. The multilayer component assemblies 126a-126b, 136a-136b are interconnected by a conductive element 128, 138 that is embedded in the base layer of the top component voxel 120b, 130b and extends through the outer layer and lattice structure of the bottom component voxel 120a, 130a. The interconnected structure of conductive elements in each pair of component voxels 122, 132 can function together as, e.g., a multi-layer inductor or coil. The lattice and strut structures of the component voxels 122, 132 provide structural support and a framework for input/output manifolds for a fluidic network, e.g., enabling convection flow for thermal management.

In some examples, component voxels including 3D printed components and materials can be integrated to form complex material structures such as metamaterial structures. A metamaterial is a material having properties, e.g., electrical, magnetic, or optical properties, that derive from the fabricated structure of the material. A metamaterial structure can be implemented as a composite set of component voxels arranged in a regular, repeating pattern, where each component voxel contains one or more component structures (e.g., active or passive devices, conductive elements, insulating elements). In some examples, the component structures in component voxels that make up a metamaterial structure can be formed at least in part of nanomaterials such as nanoparticles or nanotubes. In some examples, a metamaterial structure realized by a pattern of component voxels can be intermixed with other component voxels (e.g., component voxels that do not contribute to the properties of the metamaterial structure) to form a device, system, or subsystem having heterogeneous functionality. Examples of metamaterial structures that can be realized by patterns of component voxels include lenses, e.g., electromagnetic field focusing lenses having reflection functionality to enhance electromagnetic field characteristics; structures for RF or beam steering antenna applications, or other structures.

Figure 13A:
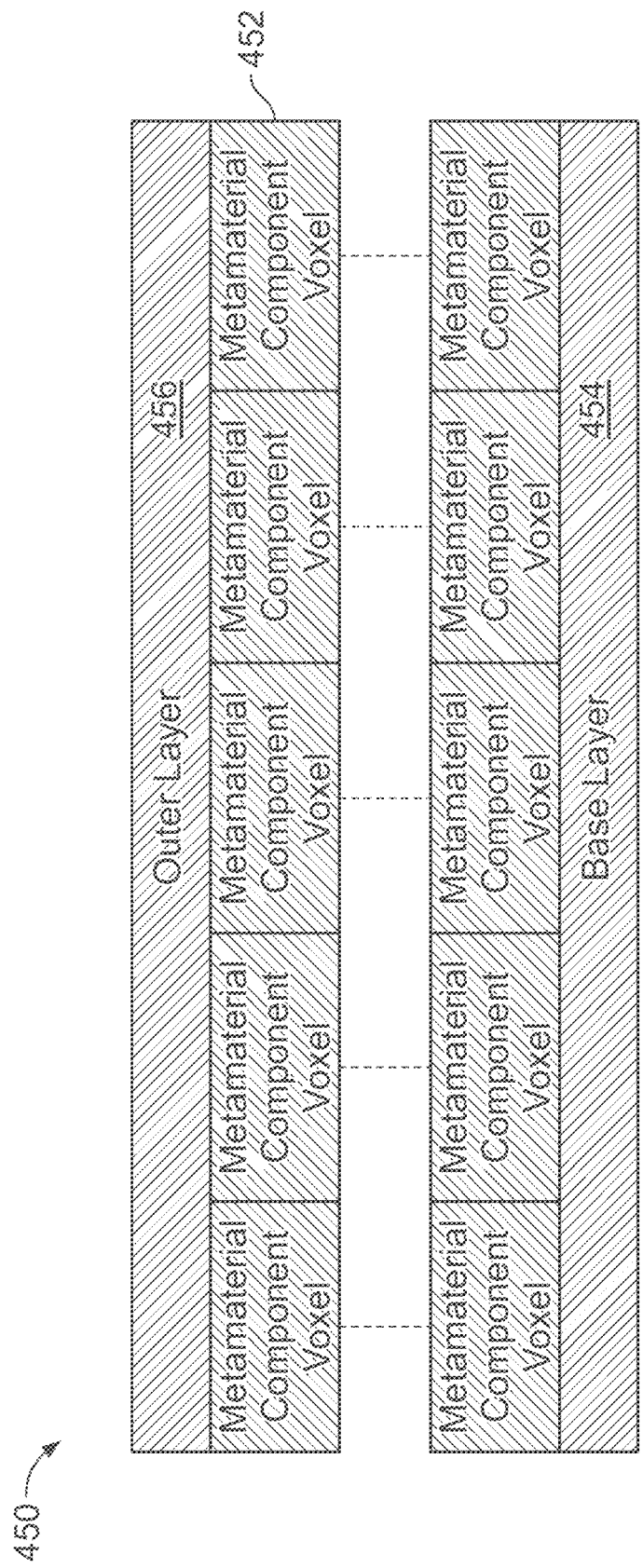

FIG. 13A illustrates a metamaterial structure 450 formed by a regular, repeating, 3D pattern of metamaterial component voxels 452. Each metamaterial component voxel 452 includes a base layer, an outer layer, and one or more component structures, as described herein, to achieve a desired property, e.g., to contribute to the functionality of the metamaterial structure 450. In this example, the metamaterial structure 450 is itself a component voxel having a base layer 454 and an outer layer 456. For instance, the metamaterial structure 450 can be integrated into an assembly of component voxels to form a target device exhibiting the properties and functionality of the metamaterial structure 450 along with other structure or functionality.

FIGS. 13B-13E illustrate examples of metamaterial component voxels. Referring to FIG. 13B, a metamaterial component voxel 458b includes a metamaterial structure 460b having a patterned insulating element with conductive elements and a device, such as an active or passive device, disposed on the patterned insulating element. The metamaterial component voxel 458b also includes other component structures, including a device 462b embedded in a base layer 464b of the component voxel 458b. A conductive element 466b connects to the device 462b, e.g., for interconnection with a conductive network that spans multiple component voxels. For instance, the device 462b can be an integrated circuit and the conductive element 466b can be a circuit connection to one or more pads of the integrated circuit.

Referring to FIG. 13C, a metamaterial component voxel 458c includes a metamaterial structure 460c having an insulating element, conductive elements, a device, such as an active or passive device. The metamaterial component voxel 458c also includes other component structures, including a device 462c, such as an active or passive device, embedded in a base layer 464c of the component voxel 458c. A conductive element 466c connects to the device 462c, e.g., for interconnection with a conductive network that spans multiple component voxels, such as for interconnection to one or more pads of an integrated circuit device.

Referring to FIG. 13D, a metamaterial component voxel 458d includes a metamaterial structure 460d. The metamaterial structure 460d includes a patterned insulating element with conductive elements disposed on the patterned insulating element. The metamaterial structure 460d also encompasses a conductive element 466d that connects to a device 462c embedded in a base layer 464d of the component voxel 458d, e.g., for interconnection purposes.

Referring to FIG. 13E, a metamaterial component voxel 458e includes a metamaterial structure 460e that includes conductive elements and devices. A conductive element 466e in the metamaterial structure 460e connects to a device 462e, such as an active or passive device, embedded in a base layer 464e of the component voxel 458e, e.g., for interconnection purposes.

When the metamaterial component voxels 458b-458e are assembled into respective regular patterns of component voxels (e.g., identical component voxels or component voxels having other structure or metamaterial functionality), a target device having the metamaterial functionality enabled by the constituent metamaterial component voxels can be formed. For instance, the conductive elements within the metamaterial structures of the component voxels can form part of a conductive network that interconnects the metamaterial structure to enable metamaterial functionality to be realized by the pattern of metamaterial component voxels.

In some examples, deposition of materials, such as micromaterials or nanomaterials, onto lattice or strut structure in a component voxel can be used to implement a metamaterial structure in the component voxel. The nature and location of the deposited material can impact the properties of the metamaterial structure. Referring to FIG. 14A, in an example of a metamaterial component voxel 470a, a lattice structure is coated with a microparticle or nanoparticle material, e.g., by deposition during the additive construction of the component voxel 470a. In the component voxel 470a, different regions of the lattice structure are coated with different compositions of microparticle or nanoparticle material to achieve a desired metamaterial functionality. Referring to FIG. 14B, a metamaterial component voxel 470b has an arrangement of lattice and strut structure with various compositions of microparticle or nanoparticle material deposited thereon to achieve a desired metamaterial functionality. Referring to FIG. 14C, metamaterial component voxels can be assembled in various orientations, e.g., to provide a collective metamaterial functionality. For instance, assemblies of metamaterial component voxels can provide for graded material scenarios, e.g., with regions of the graded material having a different composition (e.g., having a lattice or strut structure coating with a different composition of microparticle or nanoparticle material) and thus having a different functionality.

In some examples, component voxels can be assembled to create target devices having microfluidic functionality (referred to as a "target microfluidic device"). Such component voxels can include component structures that are elements of microfluidic systems, e.g., digitally controllable microfluidic systems. Such elements include passive microfluidic elements, such channels or manifolds that form part of a fluidic network that spans multiple component voxels; or active microfluidic devices, such as actuators, e.g., pumps, valves, mixers, or switching systems. Component voxels having microfluidic system elements can also include other component structures, such as conductive or insulating elements or other types of devices. FIGS. 15A-15D show example component voxels 550a-550d that can form part of a target microfluidic device; other arrangements of component structures in component voxels for target microfluidic devices are also possible. Target devices having microfluidic functionality can be used for, e.g., biospecimen mixing and routing in conjunction with analysis systems or devices.

Referring to FIG. 15A, the component voxel 550a includes a base layer, an outer layer, and a lattice structure. A microfluidic channel 560 is defined in the interior space of the component voxel 550a. For instance, the microfluidic channel 560 in combination with microfluidic channels of other component voxels can form a fluidic network for transport of fluid (e.g., liquid or gas) through the target microfluidic device.

Referring to FIG. 15B, the component voxel 550*b* includes a base layer, an outer layer, and a lattice structure. Microfluidic channels and manifolds are defined in the interior space of the component voxel 550*b*, e.g., to form part of a fluidic network that spans multiple component voxels in the target microfluidic device. The component voxel 550*b* also includes active microfluidic devices, such as one or more valves, pumps, or mixers, to control or modify fluid flow through the fluidic network.

Referring to FIG. 15C, the component voxel 550*c* includes a base layer, an outer layer, and a lattice structure. Microfluidic channels and manifolds are defined in the interior space of the component voxel 550*c*, e.g., to form part of a fluidic network that spans multiple component voxels. The component voxel 550*c* also includes active microfluidic devices, such as one or more valves, pumps, or mixers. In addition, the component voxel 550*c* includes conductive and insulating elements, e.g., that form part of a conductive network that spans multiple component voxels; and a device, such as an electronic device. The conductive and insulating elements and device can contribute to functionality that controls operation of active microfluidic devices in the component voxel 550*c* or in other component voxels, e.g., acting as a network of electrodes for controlling fluid propagation and actuation (e.g., electrowetting or dielectrophoresis, among others) through the fluidic network, for example for applications related to transport or manipulation of droplets or sample assays.

Referring to FIG. 15D, the component voxel 550*d* includes a base layer, an outer layer, and a lattice structure. A microfluidic assembly including microfluidic channels and manifolds and active microfluidic devices is disposed in the interior space of the component voxel 550*d*. In the microfluidic assembly, multiple, planar microfluidic channels are separated by active microfluidic devices.

In some examples, the base layer of a component voxel can be defined as any of multiple surfaces of the component voxel. For instance, in a cubic or rectangular component voxel, one or more base layers can be defined as any of the interior surfaces (e.g., the bottom surface, four side surfaces, or top surface), or any of the five interior surfaces other than the top surface, of the component voxel. This allows the component structure(s) of the component voxel can be disposed on or embedded in any of those interior surfaces, e.g., on adjacent surfaces in a single component voxel. This structure can be achieved, e.g., by using a multi-axis additive system able to rotate and tilt (e.g., pitch, yaw, and rotate).

Figure 16:
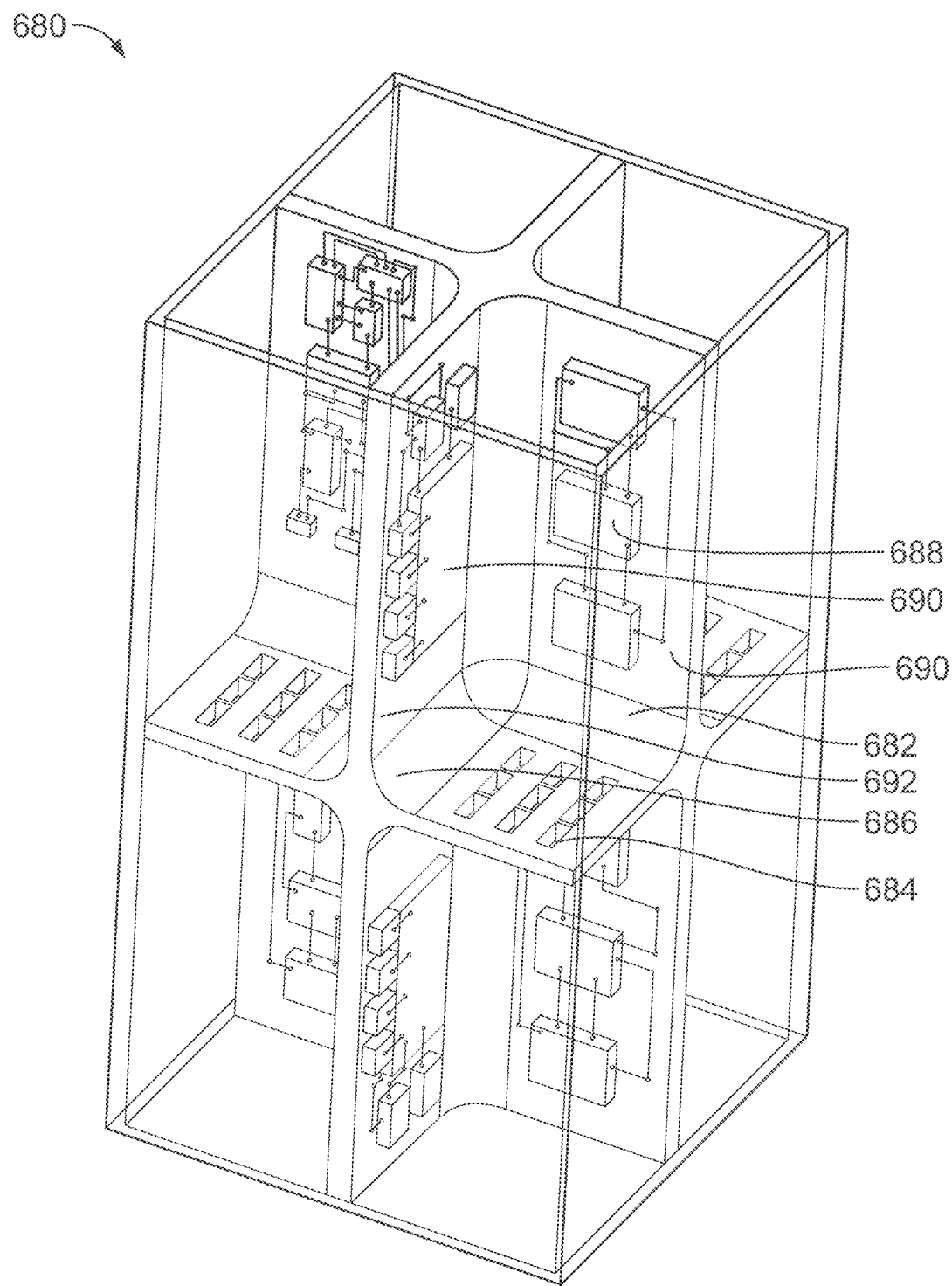
FIG. 16 is a diagram of an example device based on an assembly of component voxels.

Referring to FIG. 16, an example device 680 based on a component voxel assembly 680 includes eight component voxels, one of which is shown as component voxel 682. The component voxel has component structures 684 embedded in a bottom base layer 686, component structures 688 disposed on a first side base layer 690, and component structures 690 disposed on a second side base layer 692. The component structures 684 are input/output manifolds or fluidic channels that form part of a strut and provide thermal management (e.g., cooling) functionality and structural integrity to the component voxels and to the device 680 as a whole. Similar arrangements of component structures exist in the other component voxels of the component voxel assembly 680.

Figure 17A:
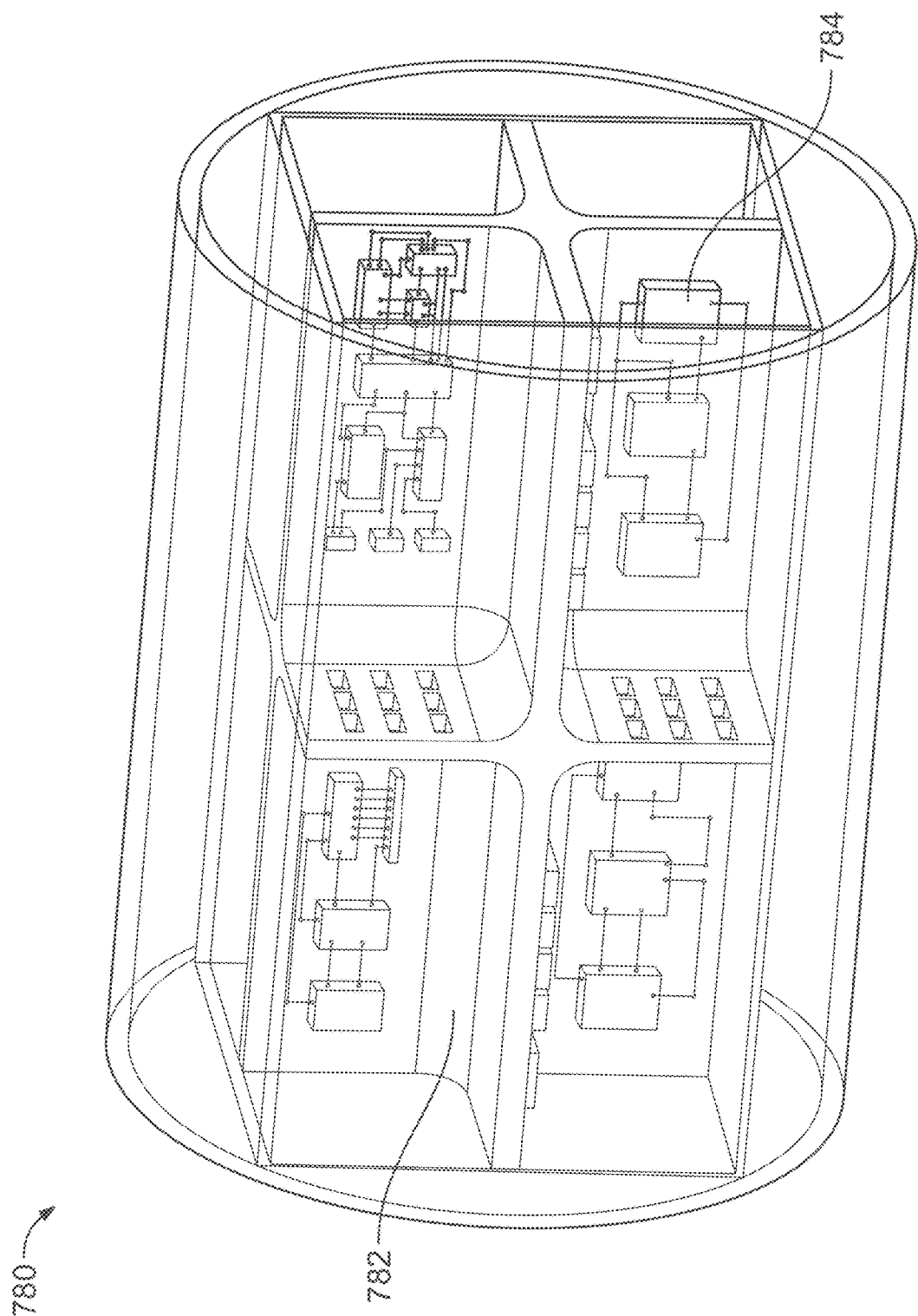
FIGS. 17A-17B are diagrams of example devices based on assemblies of component voxels.
Figure 17B:
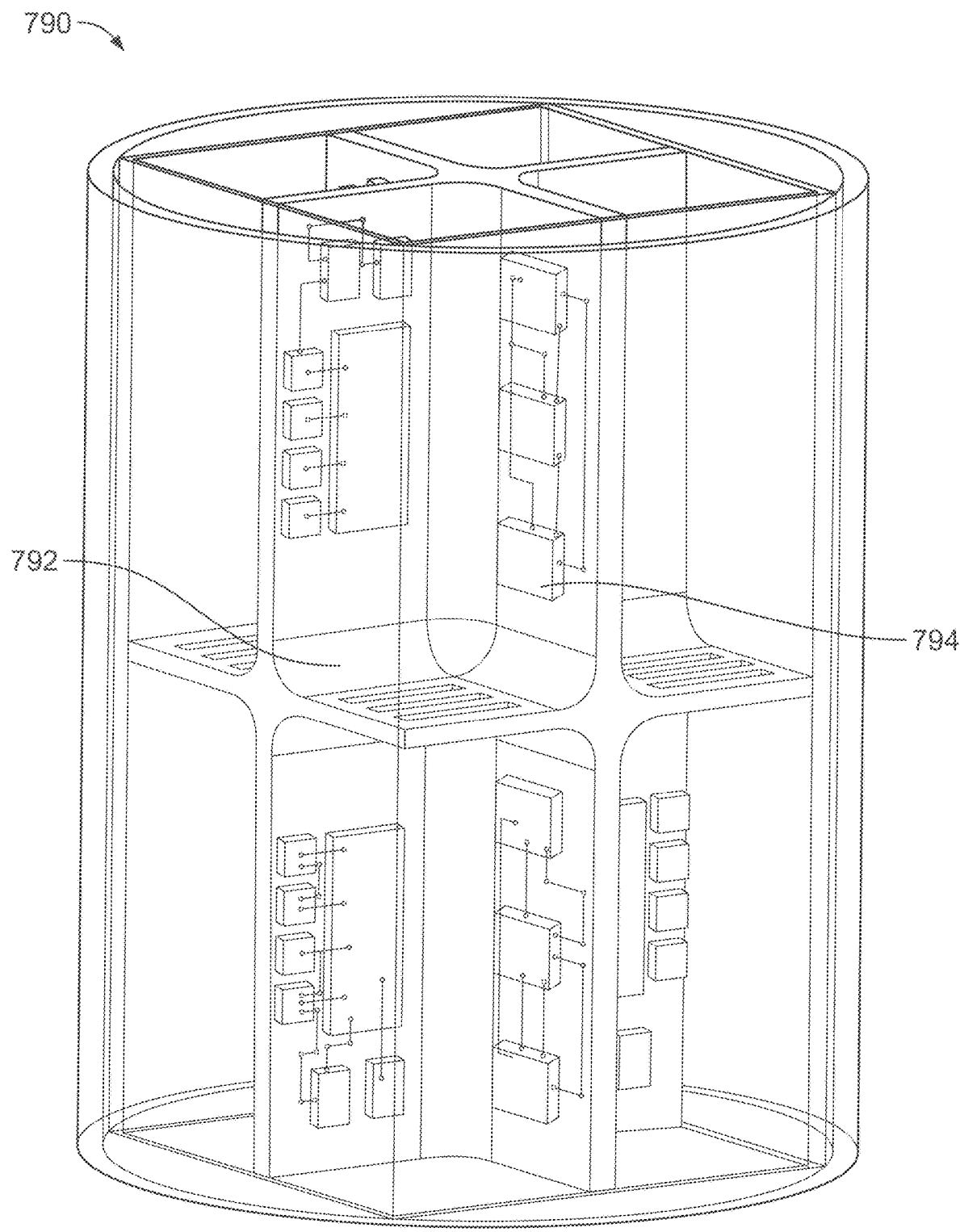

When a device has curved interior surfaces, e.g., when the device is cylindrical, the component voxel can contain dividing compartment wall such that component structures can be disposed on or embedded in various interior surfaces of the component voxel. Referring to FIG. 17A, an example device 780 is based on an horizontally-oriented cylindrical component voxel assembly. Each component voxel includes interior compartment walls 782, with component structures (e.g., component structures 784) disposed on or embedded in at least some of the compartment walls. A cylindrically shaped conformal surface layer 786 is formed around the component voxels to provide the cylindrical shape of the device 780. Referring to FIG. 17B, an example device 790 is based on an assembly of vertically-oriented cylindrical component voxels includes interior compartment walls 792, with component structures (e.g., component structures 794) disposed on or embedded in at least some of the compartment walls.

The devices 780, 790 of FIGS. 17A and 17B depict examples in which electronic devices are fabricated within component voxels as part of voxelization of a target object, which in these examples is a cylindrical device. These examples also depict how an outer layer and a conformal surface layer (in these examples, a cylindrical conformal surface layer) is formed around a set of cubic component voxels to finalize the geometry of the target object. In the examples of FIGS. 17A and 17B, each component voxel is a rectangular or cubic component voxel with a curved outer surface such that together the cylindrical shape of the device is formed. In some examples, when a device is formed of multiple levels of component voxels, interior component voxels are, e.g., cubic or rectangular, and the outermost level of component voxels have outer surfaces to form the shape of the device. In some examples, such as to form a toroid-shaped device, both innermost and outermost component voxels have outward-facing surfaces that form the shape of the device, and component voxels of interior levels are, e.g., cubic or rectangular.

Figure 18:
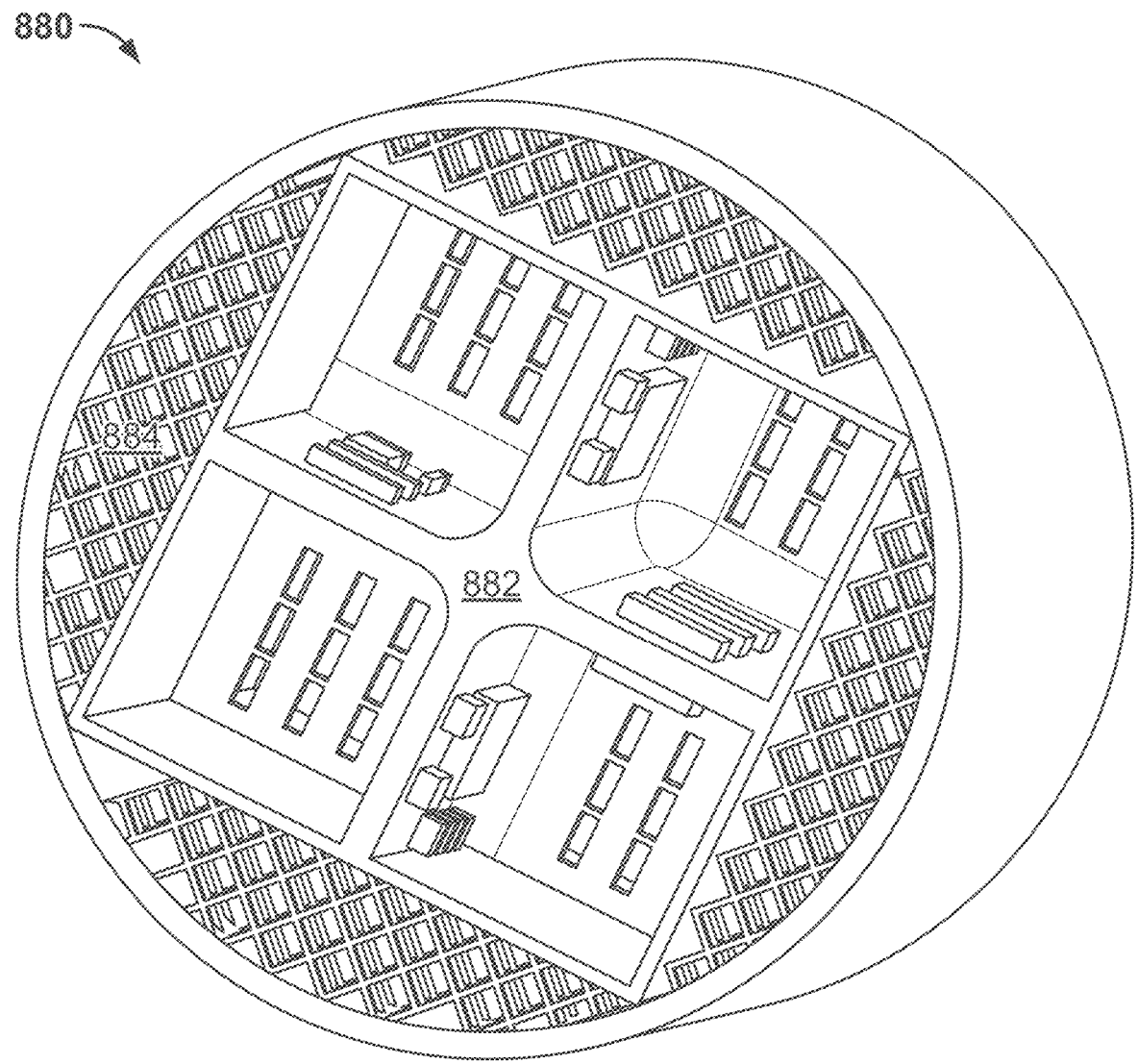
FIG. 18 is a diagram of an example device based on an assembly of component voxels.

FIG. 18 is an example of a cylindrical device 880 including component voxels having interior compartment walls 882, with component structures disposed on or embedded in at least some of the compartment walls. The device 880 includes a lattice structure 884 disposed in in a volume adjacent to the compartment walls 882, with the lattice structure 884 forming a surface for and supporting a cylindrically shaped conformal surface layer 886.

Figure 19:
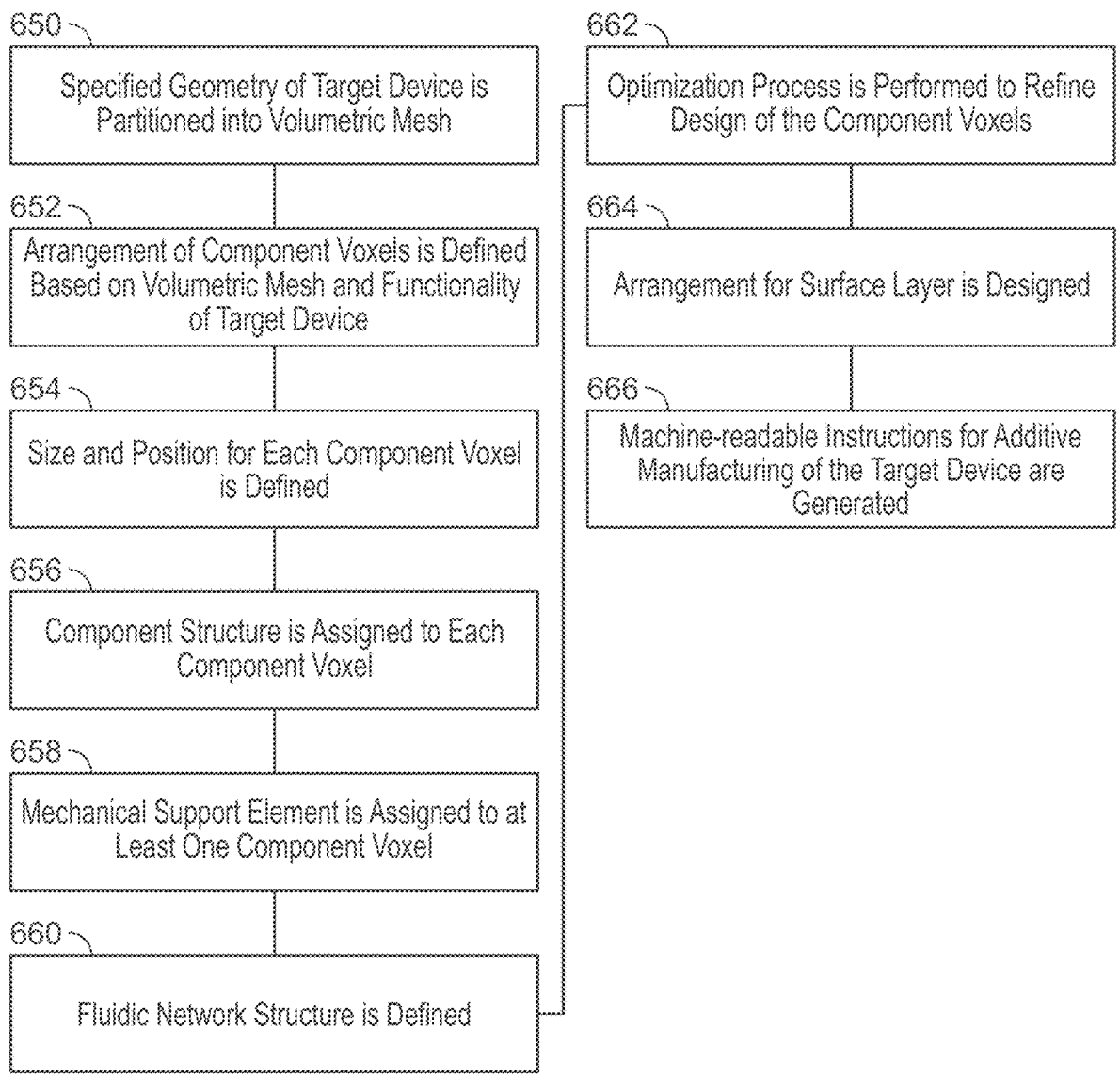
FIG. 19 is a flow chart.

Referring to FIG. 19, in a general approach for designing a target device to be fabricated by an additive manufacturing process, a specified geometry of the target device is partitioned into a volumetric mesh including an assembly of mesh units each having a corresponding size and position (650). An arrangement of component voxels is defined based on the geometric mesh and based on a specified functionality of the target device (652). Each component voxel corresponds to one or more of the mesh units of the volumetric mesh. Specifically, a size and position for each component voxel in the specified geometry of the apparatus is defined (654) and a component structure can be assigned to each of one or more component voxels (656), with the component structure for a given component voxel being associated with a functionality to be exhibited by that component voxel. For example, one functionality realized by at least one of the component structures may be an electronic system composed of various active and passive devices wired according to a schematic netlist definition. The component structure can include an interconnected conductive network among the assembly of component voxels. An optimization process can improve upon the floor-planning (placement within each component voxel) of active and passive devices, as well as circuit routing, e.g., to minimize the number of interconnections and the respective distances between active and passive devices. A mechanical support element, such as a lattice or strut element, is assigned to at least one of the component voxels to provide structural integrity (658) and an optimization process is executed to assign the material, geometrical, and distribution properties of each lattice and strut position to satisfy design and performance criteria of the target device. A fluidic network structure, such as an interconnected network of channels or manifolds, is defined throughout the assembly of component voxels, e.g., for thermal management or microfluidics purposes (660) and an optimization process is executed to assign the fluidic structure to satisfy thermal characteristics, design, and performance criteria of the target device.

One or more optimization processes can be performed to refine the design of the component voxels (662). The optimization process can include designer specified optimization methods, computational optimization methods, or both. Optimization can include minimization of the number of component voxels (e.g., by clustering or aggregating component voxels) or a maximization the volume per component voxel (e.g., by maximizing the functional domains, geometrically reshaping or making geometry adjustments to optimize for spatial properties of the target device, or both), subject to the geometry and functionality of the target device. The optimization process can include a concurrent optimization of structural integrity (e.g., based on a load or stress analysis and topological optimization methods) to adjust the geometry, material properties, and distribution characteristics of both the component voxel materials and the assembly of lattice and strut structures. One of more optimization processes can be performed to refine the design of the component voxels to satisfy thermal criteria to design or optimize the layout of the fluidic network structure, e.g., to ensure all active and passive devices within component voxels will operate within a suitable temperature range and that heat dissipation criteria will be satisfied.

An arrangement for a surface layer is designed (664). The surface layer, corresponding to the external surface of the target device, can be a smooth, conformal surface layer.

Machine-readable instructions for manufacturing, e.g., additive manufacturing, of the target device are generated (666). The instructions can be instructions for multiple manufacturing tools and their collective orchestration, with each tool designated to carry out a corresponding portion of the manufacturing process. The tools can be additive manufacturing tools, robotic or actuated assembly tools, or other types of tools.

Figure 20A:
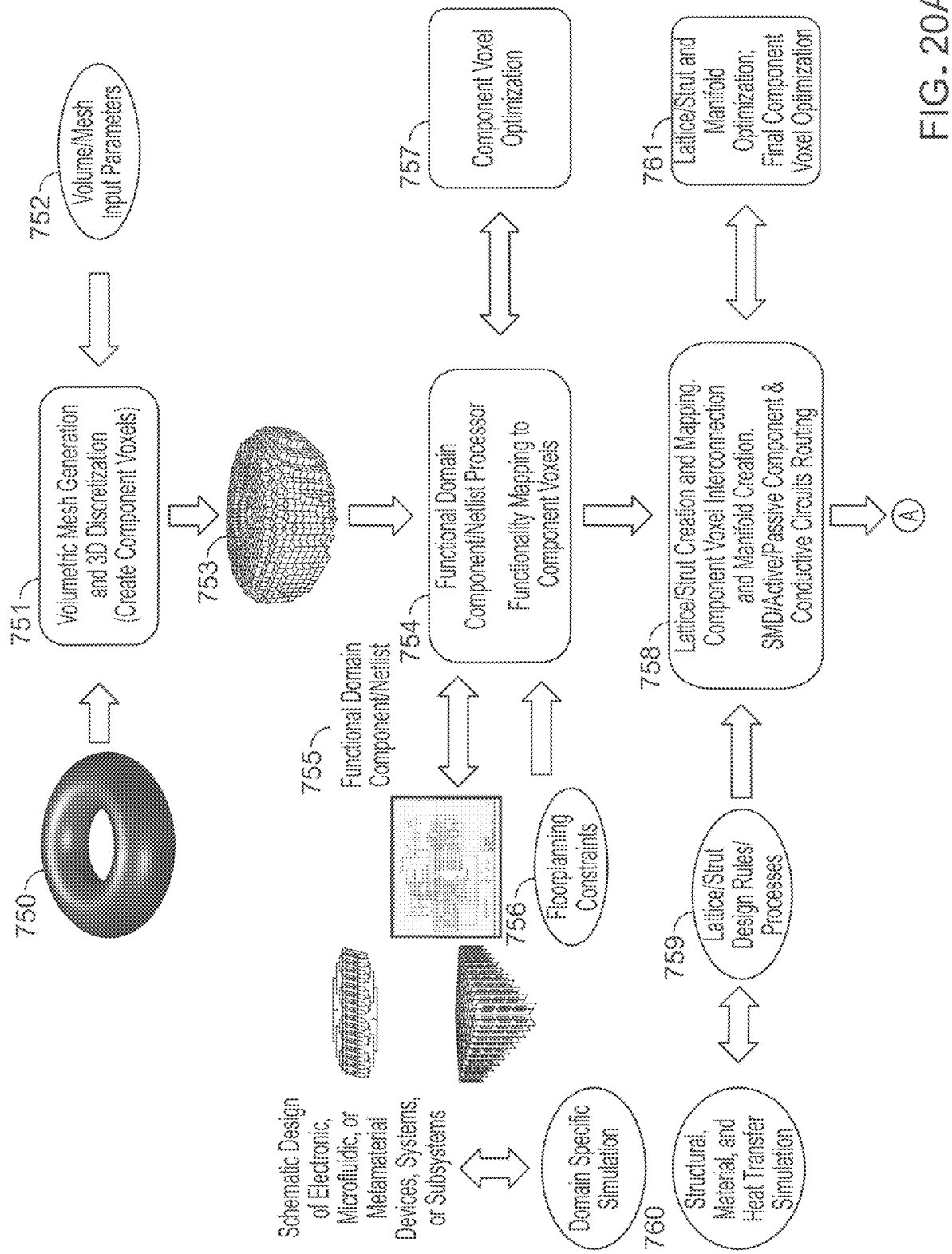
FIGS. 20A-20B are a process flow diagram.
Figure 20B:
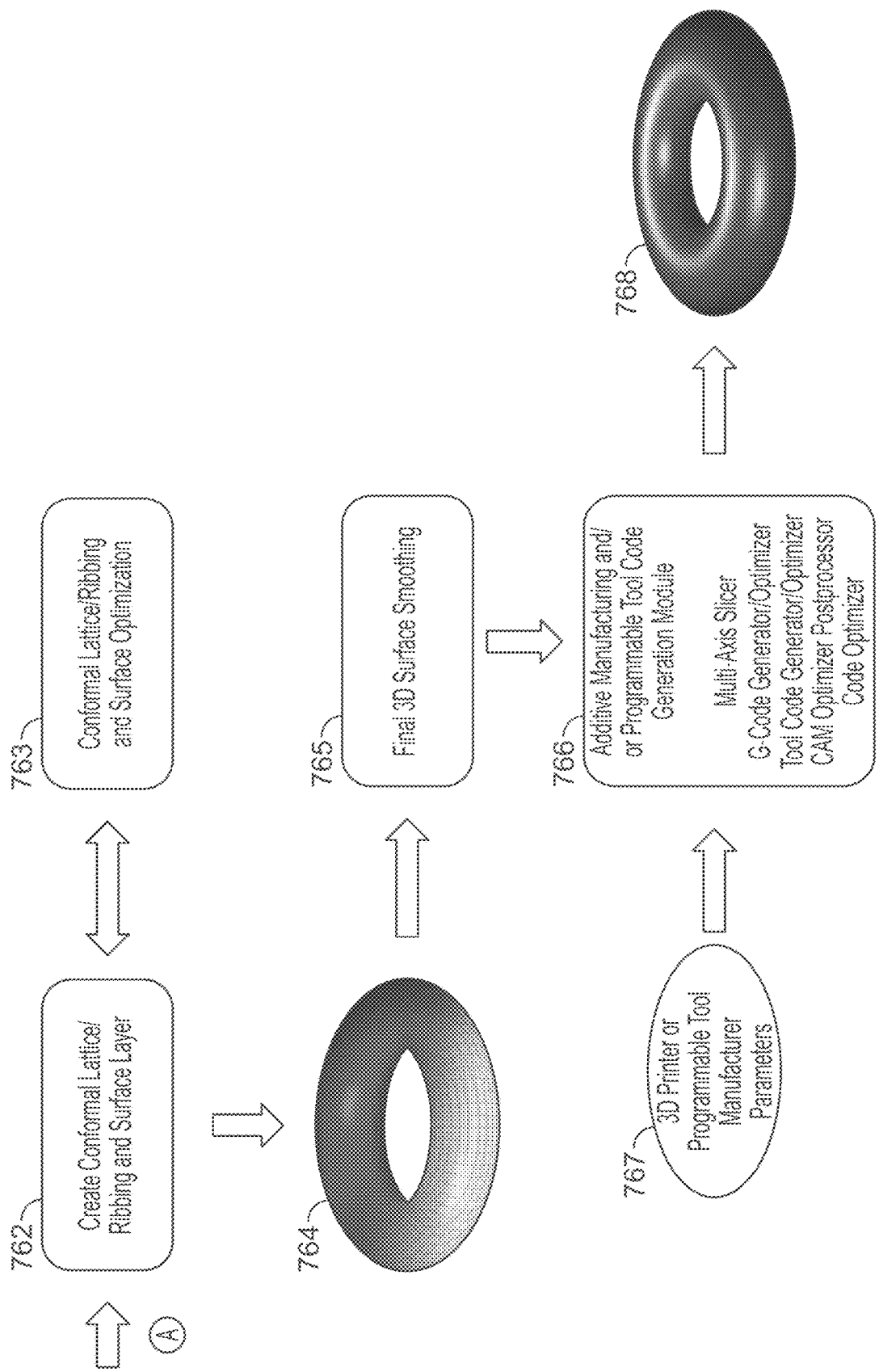

FIGS. 20A-20B illustrate an example process for developing a design specification and the program synthesis for the generation of instructions for one or more additive manufacturing tools to fabricate a target device composed of component voxels. In general, a process for designing a target device composed of component voxels is an iterative process that integrates optimization process based on a variety of criteria, such as functional, mechanical, thermal, geometric, or other criteria. Computer-implemented design technologies, such as Computer Aided Engineering (CAE), 3D-Computer Aided Design (CAD), Computer Aided Manufacturing (CAM), Multiphysics and engineering simulation tools, or other technologies and computational methods, can be employed independently or collectively within an integrated software platform for developing the design specification of the target device. The output of the design process is an executable instruction set that enables an additive tool or system of tools, along with other tools as appropriate, to build the target device according to the design specification developed by the iterative design process.

At the outset of the design process, the geometry (size and shape) of a target device 750 is defined. The geometry of the target device is converted into an initial set of component voxels by a volumetric mesh generation process (751). The shape, size, and number of component voxels is approximated based on the target geometry and based on one or more volume/mesh input parameters 752 such as number and size of components, material definitions, high-level physical and domain constraints, or other parameters, or a combination thereof. The output from the volumetric mesh generation process is a definition of an approximate structure 753 composed of a set of component voxels, in which the geometry of the component voxels has not yet been optimized.

The functionality of the target device is then mapped in a functionality mapping process 754 to the set of component voxels in the approximate structure 753. Specifically, domain specific definitions 755, e.g., in the form of domain specific component and network or netlists, are provided as input into the functionality mapping process. Domain specific definitions 755 can include design capture and definition tools (schematic capture) for functionality domains such as electronic, metamaterial, or fluidic design domains. The design space is not limited to these functional domains, but instead can be extended to additional or alternate functionality domains. For instance, such tools can operate with domain specific simulation sufficient to optimize domain definitions input into a functional domain component/netlist processor whose function is to ingest multiple functional domain representations (e.g., component definitions, netlists, etc.) into an internal format utilized by the functionality mapping process 754. For instance, a change in one aspect, such as a functional domain or a netlist, can result in a change in one or more other functional domains or in the netlist, because of the integration among features and domains in the design of the component voxel representation. Initial floorplan constraints 756 are also considered by the functionality mapping process 754 to optimize the functional mapping between domain specific definitions and the physical component voxel definitions. In some examples, functional domains (e.g., components, netlists, interconnections, thermal heat-maps, or structure heat or color maps of loads or stress, topologically optimized material distributions, or other functional domains) are analyzed in relation to a free-form, optimized or non-optimized set of component voxels to enable conceptualization and visualization of an integrated set of domains and design patterns made possible by the set of component voxels making up the target device. In some examples, external functional domain creation and simulation tools can be incorporated or dynamically linked to the functional domain/netlist processor and component voxel mapping processes to enable seamless integration among operations of the design process, e.g., providing improved efficiency and utility for the design process. In some examples, the collection of design processes are incorporated into an integrated software.

In a component voxel optimization process 757, the approximate structure 753 is refined, e.g., to minimize the number of component voxels, maximize the volume characteristics and functional density (e.g., circuit density) of the component voxels, e.g., to minimize both number of component voxels and the number of inner layer geometries in relation to the functionality domains. For instance, the minimization of the number of component voxels or maximization of volume characteristics or functionality density can be achieved by geometrical (e.g., shape or size) transformations, clustering analysis, floor planning optimizations, or other suitable approaches. In an example, component voxel volume can be maximized based on regions of the structure having common functionality, materials, properties, or a combination thereof. For instance, if two component voxels directly adjacent to one another are substantially identical, these two component voxels can be optimized into a single, larger component voxel exhibiting the same functionality as the two individual component voxels. The output of the component voxel optimization process 757 is an improved approximate structure. In some examples, the component voxel optimization process can encompass a visualization of the current state of the integrated functional domains relative to the set of component voxels in the approximate structure that facilitates an incorporation or modification of the implementation and mapping of functional domains. For instance, a visualization of each of one or more of the functional domains (e.g., a schematic capture visualization, a visualization of a finite element analysis, a visualization of a heat transfer simulation) or other visualizations can be integrated into a visualization of the component voxel representation, where each visualization can be updated, e.g., according to a synchronization process or in real time, based on a change in one or more of the functional domains.

The output from the functionality mapping process 754 is used for a structural design process 758 that produces a design of lattice and strut structures for the component voxels and a design of interconnection networks (e.g., fluidic and/or electrical networks and their respective routing) and corresponding manifold design. The structural design process 758 can be based on computer-implemented modeling or other analysis, such as a finite element analysis or topological optimization techniques. In the structural design process 758, embedded components and interconnecting networks are routed within components voxels and across multiple component voxels of the target device. In addition, design specifications 759 for lattice structures, strut structures, or both, are developed, including specifications for materials deposition definitions (e.g., process rules for microparticle or nanoparticle deposition), provisions for hollow or sparse regions for fluidic based heat dissipation or power consumption, and structural and load- or stress-bearing criteria. For instance, including topological optimization techniques can be used to define distributed material properties of each component voxel. In some examples, simulations 760, such as structural, materials, or heat transfer simulations, can be used to define input constraints for the development of lattice and strut structure design specifications.

The structural design process 758 can incorporate an optimization process 761 for lattice structures, strut structures, and manifolds, e.g., to minimize the number of lattice and strut structures or to optimize thermal transfer capacity, which can contribute to improved power dissipation and structural performance of the target device. In some examples, the optimization process 761 can also incorporate optimization of the structure and interconnection of the component voxels, circuits, routing, component voxel geometry, materials deposition, metamaterials, fluidic network elements, or other aspects of component voxel structure. For instance, the structure and interconnection optimization can take into account the additive manufacturing, tooling, and material selection processes to be used to manufacture the target device.

The output of the structural design process 758 is a fully designed and optimized definition of a functional structure having a close approximation of the geometry of the target device. A conformal lattice structure and surface layer are then defined in a surface definition process 762 to realize the final surface finish and shape of the target device. The surface definition process 762 relies on a surface optimization 763 in which conformal lattice or ribbing structures are modified in conjunction with external component voxels, fluidic manifolds, and structural supports to achieve a nearly final outer surface layer 764. The nearly final outer surface layer 764 is then smoothed in a smoothing process 765, such as a fine-grained Laplacian approach, to produce a final geometry.

The final geometry, including the specification of the component voxels with the smoothed outer surface layer, is converted (766) into computer-readable instructions for the additive manufacturing of the target device. For instance, the final geometry can be provided to a system, such as a CAM system, that includes a multi-axis slicer, build optimizer, tool optimizer, work flow optimizer, and postprocessor code generation module. The system converts the final geometry into a set of language commands, work flows, optimized, organized and understood by one or more tools or tool systems (e.g., including an additive manufacturing system such as a 3D printer) and the appropriate work flow orchestration that make up an integrated manufacturing system.

When one or more components of the integrated manufacturing system is programmable utilizing a computer aided manufacturing formats, e.g., GCODE or another high-level programming languages or scripts, commands of the appropriate format are generated. In some examples, a modular postprocessor maintains one or more additive manufacturing systems, 3D printers and tool specific code generators enabling support for multiple tool systems such as additive manufacturing devices, 3D printers, programmable tools, sintering tools, curing tools, measurement tools, pick-and-place tools, and robotic tool systems. Such modular postprocessors may be updatable, extendable, or reconfigured for the collection of 3D printers, programmable tools, or robotic tool systems in use.

The generation of instructions 766 is based on system parameters 767 specific to the additive manufacturing systems, 3D printers, tools, or tool systems, such as definitions, tool respective mapping, and tool configurations. The resulting instructions capture the geometries, thermal considerations, and functionality developed in the design specification development processes, including supporting structures, lattices, meshes, struts, surface layers, circuit netlists, conductive interconnects and routing, definition, placement, and interconnection of components and materials (e.g., electronic, metamaterial, fluidics, metals, dielectrics, plastics, ceramics, nanomaterials, or other materials). The result is the generation of printer or tool system specific output code format for managing the desired set of all 3D printer or 3D printers, tool types and systems, and integrated manufacturing processes and workflows, suitable for fabrication of a fully manufactured target device 768.

Figure 21A:
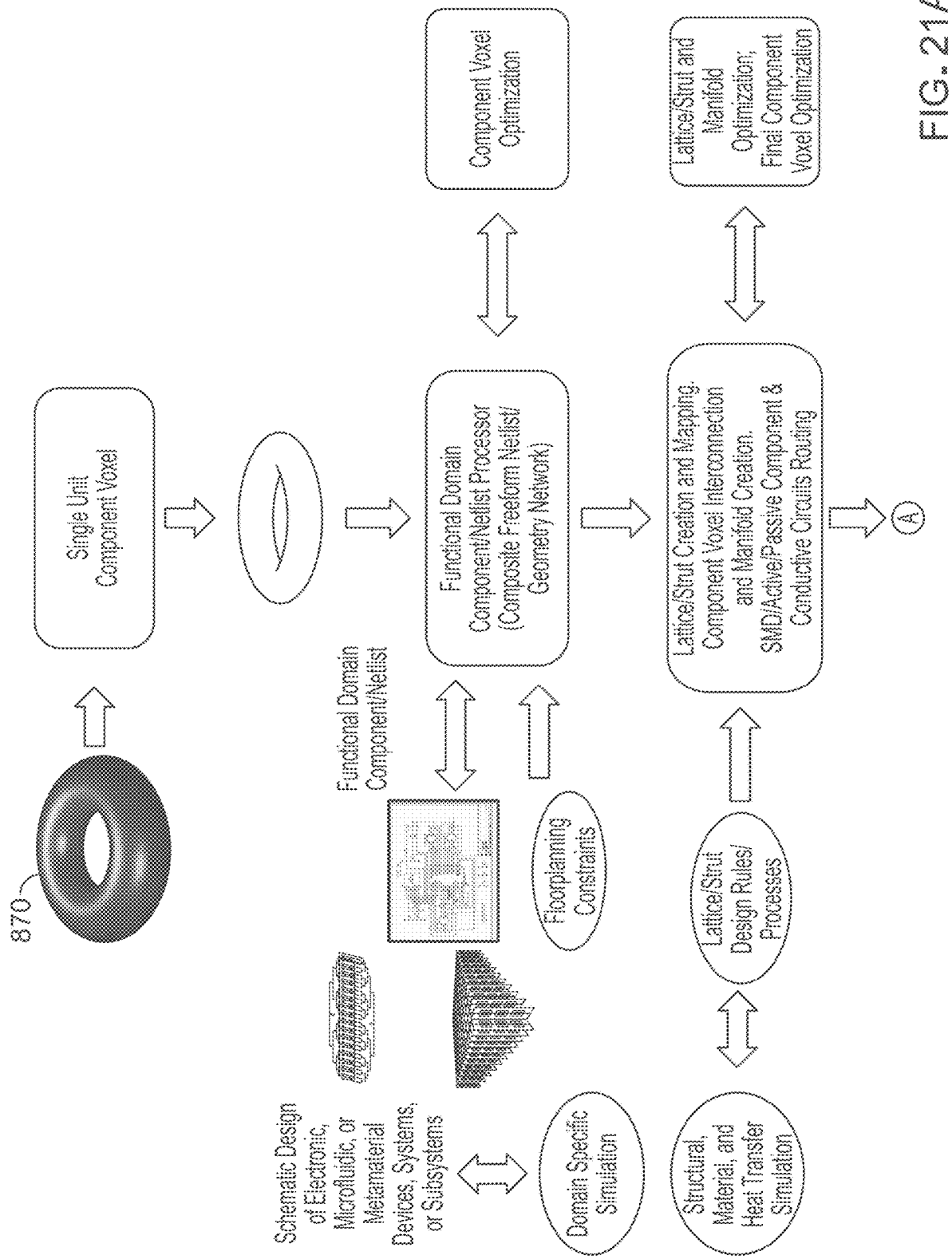
FIGS. 21A-21B are a process flow diagram.
Figure 21B:
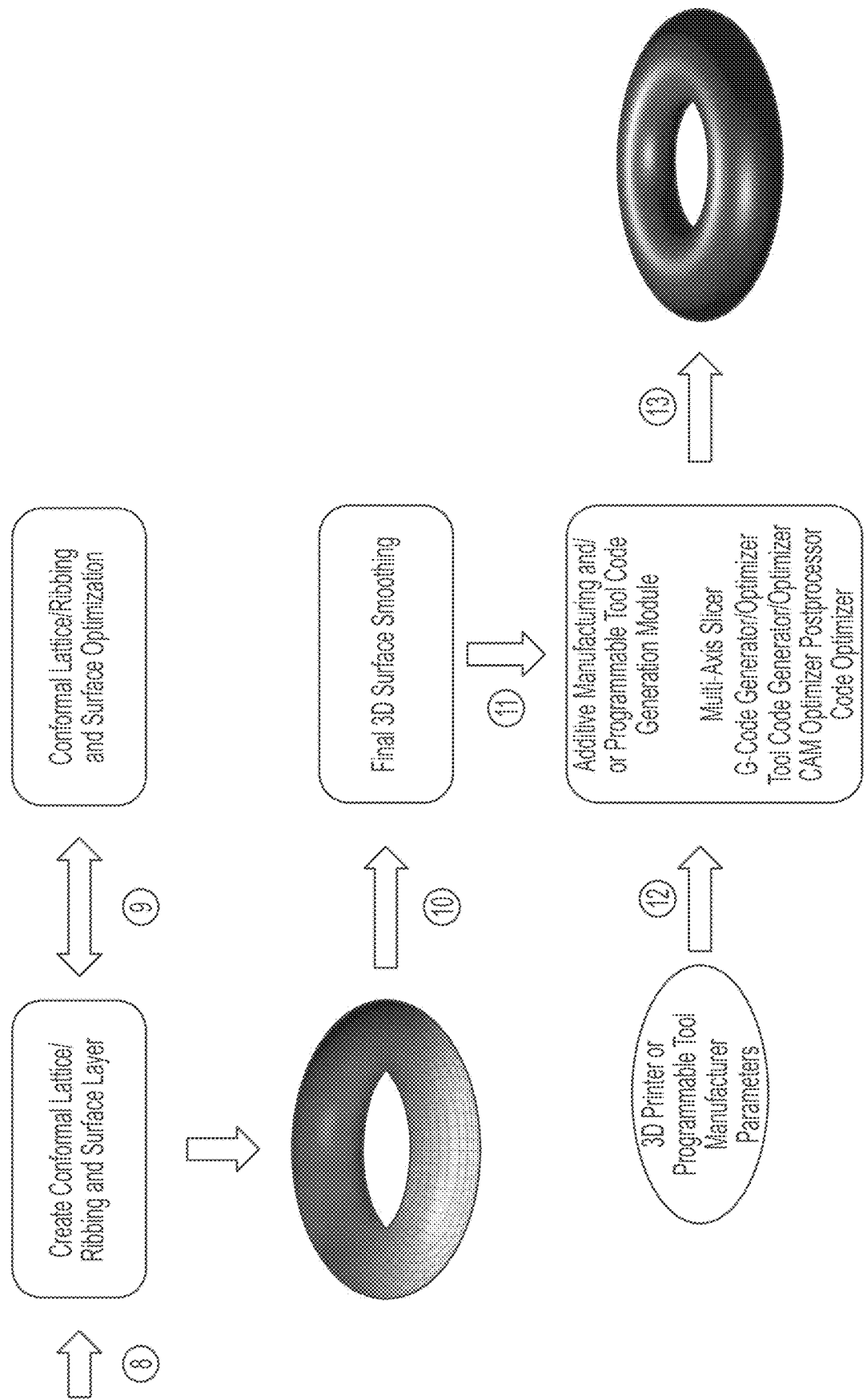

FIGS. 21A-21B illustrate a simplified design process for cases in which a target device 870 is represented by a single component voxel. The representation of the target device is the single component voxel (here, an empty torus) within which functional components and structures are to be additively deposited. In the single component voxel case, optimization similar to the multi-component voxel case is simplified such that a designer. can similarly utilize the design process of FIGS. 16A-16B, the design process can incorporate a visualization of functional domains (e.g., components, netlists, interconnections, thermal heat-maps, load/stress/structural heat/color maps) in relation to the single component voxel, in either of optimized or unoptimized states, enabling conceptualization and visualization the integrated set of domains and design patterns made possible within the single component voxels making up target device. The other aspects of the design process are consistent with those described with respect to FIGS. 20A-20B.

Figure 22A:
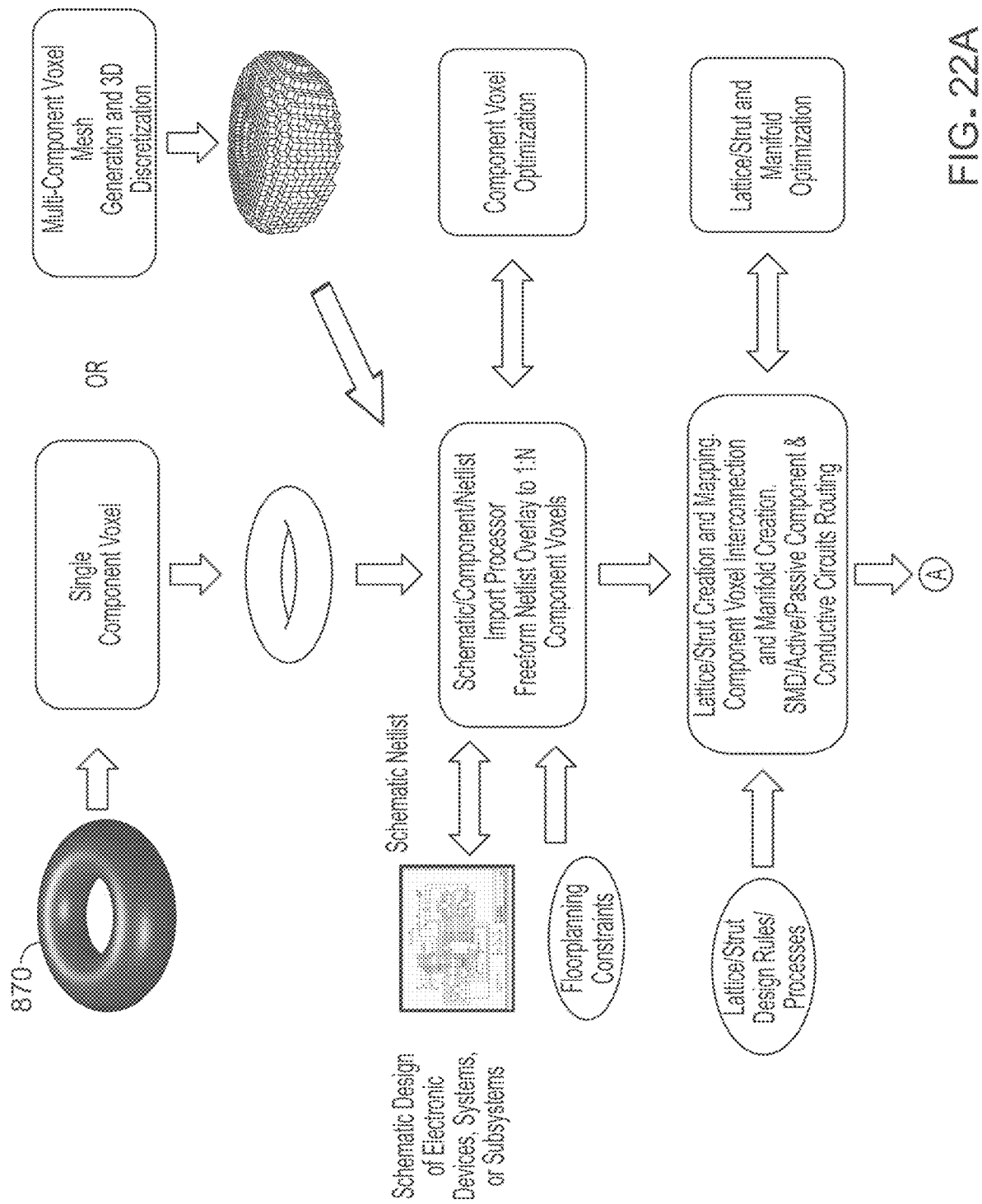
FIG. 22A-22B are a process flow diagram.
Figure 22B:
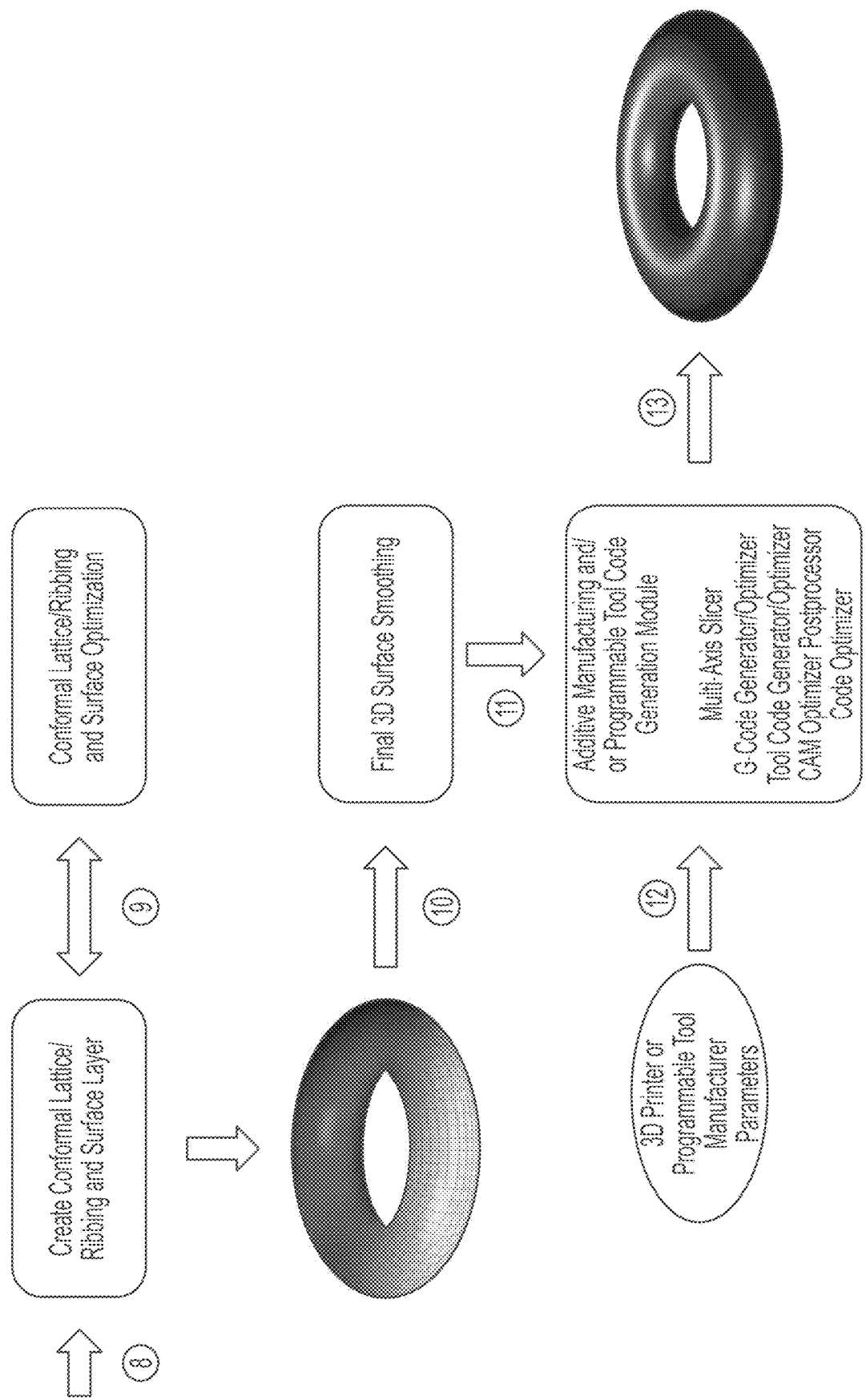

FIGS. 22A-22B illustrate another example design process for cases in which there is only one functional domain (here, an electronic domain) that is integrated into one or more component voxels. The single component voxel in conjunction with electronic schematic circuit design enables the utilization of the design methodology embodiment to additive manufacture devices and systems in accordance with existing tools, methods and additive manufacturing systems. Since there is only one domain, the functional domain processing involves importing a schematic tool netlist and part list definition. The netlist representation can be manipulated in real time within the 3D solid geometry of the composite voxels for mapping as described in the process of FIGS. 20A-20B. Once the electronic circuit netlist and electronic component information is mapped to the one or more component voxels, the design process proceeds as described for FIGS. 20A-20B. In this simplified workflow, there may be no automated thermal or structural tool process methods; thermal, power, or structural design constraints can be specified during the structural design process. In some embodiments, an imported schematic netlist and part list definition may be directly and manually mapped to the component voxel geometry that can be manually adjusted; with electronic components and circuits further manipulated including part placement, circuit netlist interconnection and routing to the one or more manually defined component voxels. In this scenario, the one or more component voxel geometries, electronic circuit design, and final target device geometry is fully user-defined in accordance with the CAD system and additive manufacturing system.

Figure 23:
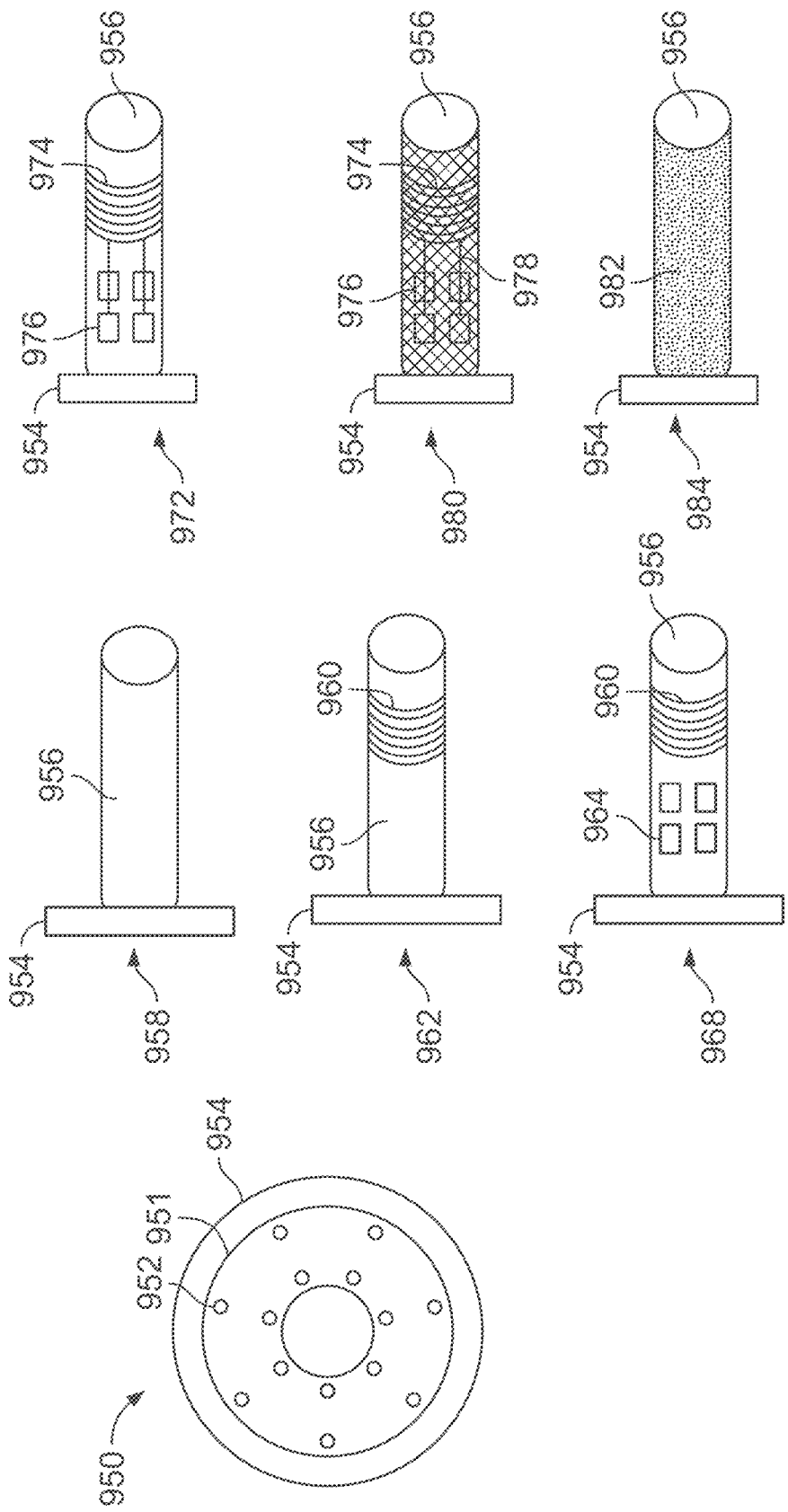
FIG. 23 is a diagram of an example fabrication process.

Referring to FIG. 23, an example fabrication process is shown for fabrication of a cylindrical device composed of a single component voxel. For instance, the device can be a two-layer solenoid coil having SMD devices, such as integrated circuits. In examples in which a device is composed of multiple component voxels, a fabrication process can incorporate the fabrication of these multiple component voxels, either individually or in an integrated, parallel fabrication process. The fabrication process begins once the component voxel structure has been designed and optimized, e.g., according to one or more of the processes described above.

The example fabrication process of FIG. 23 begins by fabricating (950) a base layer 951 and a fluidic inlet manifold 952, e.g., by printing the features 951, 952 onto a build platform 954. The base layer and fluidic inlet manifold are shown in top view in FIG. 19. The build platform is rotated and an insulating element 956 is fabricated (958), e.g., by printing or other deposition. In some examples, a curing process, such as a UV curing process, can be carried out following printing or deposition of the insulating element. In some examples, the build platform is rotated N times to enable fabrication of the cylindrical geometry of the insulating element.

A conductor, such as silver, is printed or otherwise deposited (962) on the insulating element 956 to form a first coil layer 960. For instance, the conductor can include metallic particles that are sintered following printing or deposition to form conductive lines. In some examples, the build platform is rotated N times to enable fabrication of the conductor. An insulator geometry 964 is then printed (968) onto the insulating element 956 and cured, e.g., by UV curing. Cavities are defined in the base and insulator geometries for insertion of SMD devices, e.g., by cutting into the base and insulator geometries 964. In a specific example, each cavity can be a 1-3 mm deep rectangular region. In some examples, the build platform is rotated N times to enable fabrication of the insulator geometry A second coil layer 974 is formed (972) by printing or otherwise depositing silver, e.g., followed by sintering. In some examples, the build platform is rotated N times to enable fabrication of the second coil layer. Additional components, such as SMDs 976, are placed into the cavities, e.g., by pick-and-place techniques, and interconnection circuits are printed or otherwise deposited. For instance, the SMDs can be placed upside-down into the cavities such that bond pads are exposed flush with the base layer. A fluidic network structure 978, including lattice structures, strut structures, or both, is formed (980) by printing or otherwise disposing material to form the lattice and strut structures. In some examples, the build platform is rotated N times to enable fabrication of the fluidic network structure. Finally, an outer layer geometry and a conformal surface 982 is printed or otherwise deposited to form the exterior of the device (984).

The methods and designs described for additive manufacturing of target devices is in no way limiting to those of electronic, mechanical, magnetic, optical devices, systems and subsystems. Other functional domains, geometries and thermal specifications of the current methods can be applied towards manufacturing of other modular systems such as those found in consumer electronic systems, building construction, vehicles, aerospace and automotive systems.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:
1. An additive manufactured apparatus comprising:
 an assembly of additive manufactured component voxels,
  at least some of the component voxels having been fabricated at least in part by additive manufacturing directly on other component voxels of the assembly, each additive manufactured component voxel exhibiting a corresponding functionality, each additive manufactured component voxel comprising:
  a base layer;
  an outer layer, an interior space of the component voxel being defined in a volume adjacent to the base layer and the outer layer; and
  a component structure associated with the functionality of the component voxel, the component structure being one or more of (i) disposed in the interior space of the component voxel and (ii) embedded in the base layer, wherein a first component structure of a first voxel and a second component structure of a second voxel are configured to operate together to perform a defined overall apparatus functionality, wherein the component structure of at least one component voxel of the assembly comprises a metamaterial device, in which at least one of the component voxels comprises a fluidic network structure fluidically connected to a fluidic network structure of one or more other component voxels of the assembly.

2. The apparatus of claim 1, in which at least one component voxel comprises a mechanical support element extending from the base layer to the outer layer of the component voxel.

3. The apparatus of claim 2, in which the mechanical support element comprises one or more of a strut structure and a lattice structure.

4. The apparatus of claim 1, in which the assembly of component voxels comprises one or more levels of component voxels, and in which the apparatus comprises a surface layer disposed on an outermost level of the assembly of component voxels.

5. The apparatus of claim 4, in which the surface layer comprises a conformal surface layer.

6. The apparatus of claim 1, in which at least one of the component voxels comprises electrical interconnection circuitry electrically connected to electrical interconnection circuitry of one or more other component voxels of the assembly.

7. The apparatus of claim 1, in which the component structure of at least one component voxel of the assembly comprises an electronic device.

8. The apparatus of claim 1, in which the component structure of at least one component voxel of the assembly comprises at least one of a microfluidic device and a microfluidic channel.

9. The apparatus of claim 1, in which the component structure is configured to provide structural integrity to the component voxel.

10. The apparatus of claim 1, in which the component structure is configured to enable heat transfer within the component voxel, to the component voxel, or from the component voxel.

11. The apparatus of claim 1, in which the component structure of at least one component voxel of the assembly comprises one or more of a conductive element and an electrically insulating element disposed on an interior surface of the component voxel.

12. The apparatus of claim 1, in which the base layer of at least one component voxel of the assembly has an orientation different than the base layer of one or more other component voxels of the assembly.

13. The apparatus of claim 1, in which at least one of the component voxels comprises multiple base layers, with the component structure being one or more of (i) disposed in the interior space of the at least one component voxel comprising multiple base layers and (ii) embedded in one of the multiple base layers.

14. The apparatus of claim 1, in which the interior space of at least one of the component voxels is defined between the base layer and the outer layer.

15. A method for fabricating a device, the method comprising:

fabricating an assembly of component voxels, each component voxel having a corresponding functionality, including using an additive manufacturing process to fabricate at least a portion of at least some of the component voxels of the assembly directly on other component voxels of the assembly, wherein fabricating each component voxel of the assembly comprises a step of forming a base layer and an outer layer by an additive manufacturing process, an interior space of the component voxel being defined in a volume adjacent to the base layer and the outer layer, and a step of forming a component structure associated with the functionality of the component voxel, comprising one or more of (i) a step of disposing the component structure in the interior space of the component voxel and (ii) by the additive manufacturing process, a step of embedding the component structure in the base layer, wherein the step of forming the component structure comprises, for at least one component voxel of the assembly of component voxels, forming a metamaterial device in the interior space of the component voxel, and wherein a first component structure of a first voxel and a second component structure of a second voxel are configured to operate together to perform a defined overall functionality of the device; and for at least one component voxel of the assembly, forming a fluidic network structure by the additive manufacturing process, wherein the fluidic network structure is fluidically connected to a fluidic network structure of one or more other component voxels of the assembly.

16. The method of claim 15, in which, for at least one component voxel of the assembly, the step of disposing the component structure in the interior space of the component voxel comprises fabricating the component structure by the additive manufacturing process.

17. The method of claim 15, comprising, for at least one component voxel of the assembly, forming, by the additive manufacturing process, a mechanical support element extending from the base layer to the outer layer of the component voxel.

18. The method of claim 17, in which forming the mechanical support element comprises forming one or more of a strut and a lattice.

19. The method of claim 15, in which the assembly of component voxels comprises one or more levels of component voxels, and the method comprising disposing, by the additive manufacturing process, a surface layer on an outermost level of the assembly of component voxels.

20. The method of claim 19, in which forming the surface layer comprises forming a conformal surface layer.

21. The method of claim 15, comprising, for at least one component voxel of the assembly:

forming electrical interconnection circuitry by the additive manufacturing process, wherein the electrical interconnection circuitry is electrically connected to electrical interconnection circuitry of one or more other component voxels of the assembly.

22. The method of claim 15, in which the step of forming the component structure comprises, for at least one component voxel of the assembly, disposing the component structure in the interior space of the component voxel by a pick-and-place method.

23. The method of claim 15, in which the step of forming a component structure comprises, for at least one component voxel of the assembly, disposing an electronic device in the interior space of the component voxel.

24. The method of claim 15, in which the step of forming a component structure comprises, for at least one component voxel of the assembly, disposing one or more of a microfluidic device and a microfluidic channel in the interior space of the component voxel.

25. The method of claim 15, in which the step of disposing the component structure in the interior space of the component voxel comprises, for at least one component voxel of the assembly, printing one or more of a conductive element and an insulating element on an interior surface of the component voxel.

26. The method of claim 15, in which the step of forming a component structure comprises, for at least one component voxel of the assembly, concurrently forming the base layer and the component structure embedded in the base layer.

27. The method of claim 15, in which the step of forming a component structure comprises, for at least one component voxel of the assembly:
removing a portion of the base layer; and
embedding the component structure in a space defined by the removal of the portion of the base layer.

28. The method of claim 15, comprising fabricating a first component voxel of the assembly such that the base layer of the first component voxel has a first orientation; and fabricating a second component voxel of the assembly such that the base layer of the second component voxel has a second orientation different than the first orientation.

29. A method for designing an apparatus to be fabricated by additive manufacturing, the method comprising:
by one or more processors, partitioning a specified geometry of the apparatus into a geometric mesh including an assembly of mesh units each having a corresponding size and position;
defining, by the one or more processors, an arrangement of component voxels based on the geometric mesh and based on a specified functionality of the apparatus, each component voxel corresponding to one or more mesh units of the assembly, the defining comprising:
defining a size and position of each component voxel in the specified geometry of the apparatus; and
assigning a component structure to each component voxel, wherein each component structure is associated with a functionality exhibited by the corresponding component voxel, wherein a first component structure of a first voxel and a second component structure of a second voxel are configured to operate together to perform a defined overall apparatus functionality;
by the one or more processors, generating machine-readable instructions for manufacturing of the arrangement of component voxels; and
manufacturing, by an additive manufacturing system and based on the machine-readable instructions, the arrangement of component voxels, wherein at least some of the component voxels are fabricated directly on other component voxels of the arrangement of component voxels, and
wherein at least one component voxel comprises a metamaterial device in an interior space of the component voxel, and
wherein defining the arrangement of component voxels comprises defining a fluidic network structure configured to fluidically connect component voxels in the arrangement.

30. The method of claim 29, in which generating machine-readable instructions comprises generating machine-readable instructions for additive manufacturing of at least a portion of the arrangement of component voxels.

31. The method of claim 29, in which defining the arrangement of component voxels comprises assigning a mechanical support element to at least one component voxel.

32. The method of claim 29, in which defining the arrangement of component voxels includes performing an optimization process to minimize a number of component voxels in the arrangement.

33. The method of claim 29, in which defining the arrangement of component voxels includes performing an optimization process to maximize a volume of each component voxel.

34. The method of claim 29, in which defining the arrangement of component voxels comprises performing an optimization process based on a structural analysis and a thermal analysis.

35. The method of claim 29, in which defining the arrangement of component voxels comprises defining a composition and distribution of materials within the component voxels.

36. The method of claim 35, in which defining a composition and distribution of materials comprises performing an optimization process based on structural analysis, topological optimization methodologies, or both.

37. The method of claim 29, comprising defining an arrangement of a surface layer, the arrangement of the surface layer corresponding to an outer portion of the specified geometry of the apparatus.

38. The method of claim 29, in which defining an arrangement of component voxels comprises defining a single component voxel.

39. The method of claim 29, in which one or more component voxels and an imported electronic schematic netlist and part list are placed and routed in accordance to a user-defined implementation of the one or more component voxels.

* * * * *